(12) United States Patent
Grout

(10) Patent No.: US 11,245,387 B2
(45) Date of Patent: Feb. 8, 2022

(54) SYSTEM AND METHOD FOR IMPROVED RF PULSE WIDTH MODULATION

(71) Applicant: Kevin Grout, Chandler, AZ (US)

(72) Inventor: Kevin Grout, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 17/154,437

(22) Filed: Jan. 21, 2021

(65) Prior Publication Data
US 2021/0226612 A1 Jul. 22, 2021

Related U.S. Application Data

(60) Provisional application No. 62/964,288, filed on Jan. 22, 2020.

(51) Int. Cl.
| | | |
|---|---|---|
| *H03K 3/012* | (2006.01) | |
| *H03K 3/017* | (2006.01) | |
| *H03K 19/20* | (2006.01) | |
| *H03L 7/08* | (2006.01) | |
| *H03M 3/00* | (2006.01) | |

(52) U.S. Cl.
CPC ............. *H03K 3/012* (2013.01); *H03K 3/017* (2013.01); *H03K 19/20* (2013.01); *H03L 7/08* (2013.01); *H03M 3/30* (2013.01)

(58) Field of Classification Search
CPC .......... H03K 3/017; H03K 19/20; H03L 7/06; H03L 7/08; H03M 3/30
See application file for complete search history.

(56) References Cited

U.S. PATENT DOCUMENTS

| | | | |
|---|---|---|---|
| 2010/0013531 A1* | 1/2010 | Ainspan | .......... H03L 7/093 327/159 |
| 2016/0329935 A1* | 11/2016 | Singerl | .......... H04B 1/0475 |

OTHER PUBLICATIONS

B. Franois, P. Reynaert, P. Nuyts and W. Dehaene, "Extending dynamic range of RF PWM transmitters", Electronics Letters, vol. 49, No. 6, pp. 430-432, 2013.
F. H. Raab, "Radio frequency pulsewidth modulation," IEEE Trans. Commun., vol. COM-21, No. 8, pp. 958966, Aug. 1973.
F. Yao, Q. Zhou and Z. Wei, "A Novel Multilevel RF-PWM Method With Active-Harmonic Elimination for All-Digital Transmitters", IEEE Transactions on Microwave Theory and Techniques, vol. 66, No. 7, pp. 3360-3373, 2018.

(Continued)

*Primary Examiner* — Diana J. Cheng
(74) *Attorney, Agent, or Firm* — Riverside Law LLP

(57) ABSTRACT

A system for generating an RFPWM signal comprises a delta sigma modulator having a plurality of outputs, a phase-locked loop comprising a plurality of phase quantization outputs, at least one multiplexer having a plurality of signal inputs, a plurality of selector inputs, and at least one output, the signal inputs communicatively connected to the phase quantization outputs of the phase-locked loop and the selector inputs electrically connected to the outputs of the delta sigma modulator, and a driver having an input communicatively connected to the output of the multiplexer and an output generating an RFPWM signal. A method of generating an RFPWM signal is also described.

18 Claims, 20 Drawing Sheets

(56) References Cited

OTHER PUBLICATIONS

H. Gheidi, T. Nakatani, V. Leung and P. Asbeck, "A 13 GHz DeltaSigma-Based Closed-Loop Fully Digital Phase Modulator in 45-nm CMOS SOI", IEEE Journal of Solid-State Circuits, vol. 52, No. 5, pp. 1185-1195, 2017.
H. Song and R. Gharpurey, "Digitally intensive transmitter employing RF pulse width modulation for IoT applications", 2015 IEEE Radio Frequency Integrated Circuits Symposium (RFIC), 4 pages, 2015.
J. S. Walling, S. S. Taylor, and D. J. Allstot, "A class-G supply modulator and class-E PA in 130 nm CMOS," IEEE J. Solid-State Circuits, vol. 44, No. 9, pp. 23392347, 2009.
K. Cho and R. Gharpurey, "A Digitally Intensive Transmitter/PA Using RF-PWM With Carrier Switching in 130 nm CMOS",IEEE Journal of Solid-State Circuits, vol. 51, No. 5, pp. 1188-1199, 2016.
K. Grout and J. Kitchen, "Analysis of jitter on RFPWM systems for all-digital transmitters", 2018 Texas Symposium on Wireless and Microwave Circuits and Systems (WMCS), 5 pages, 2018.
M. Javid and J. Kitchen, "A Multilevel Pulse-Width Modulated Class-E Power Amplifier", 2019 IEEE Radio and Wireless Symposium (RWS), 4 pages, 2019.
M. Pasha, M. Haque, J. Ahmad and T. Johansson, "A Modified All-Digital Polar PWM Transmitter", IEEE Transactions on Circuits and Systems I: Regular Papers, vol. 65, No. 2, pp. 758-768, 2018.
M. Taromaru, N. Ando, T. Kodera, and K. Yano, "An EER transmitter architecture with burst-width envelope modulation based on triangle wave comparison PWM," in Proc. IEEE Int. Symp. Personal, Indoor and Mobile Radio Comm. (PIMRC), Sep. 2007, pp. 15.
P. A. Godoy, S. Chung, T. W. Barton, D. J. Perreault and J. L. Dawson, "A highly efficient 1.95-GHz, 18-W asymmetric multilevel outphasing transmitter for wideband applications," 2011 IEEE MTT-S International Microwave Symposium, Baltimore, MD, 2011, pp. 1-4.
P. Nuyts, P. Reynaert and W. Dehaene, "A fully digital PWM-based 1 to 3GHz multistandard transmitter in 40nm CMOS", 2013 IEEE Radio Frequency Integrated Circuits Symposium (RFIC), pp. 419-422, 2013.
P. Nuyts, P. Singerl, F. Dielacher, P. Reynaert and W. Dehaene, "A Fully Digital Delay Line Based GHz Range Multimode Transmitter Front-End in 65-nm CMOS", IEEE Journal of Solid-State Circuits, vol. 47, No. 7, pp. 1681-1692, 2012.
P. Singerl, C. Schuberth, M. Mataln, D. Seebacher, F. Dielacher and T. Magesacher, "A 2.7-GHz multi-level PWM carrier-bursting RF transmitter", 2015 10th European Microwave Integrated Circuits Conference (EuMIC), pp. 1124-1127, 2015.
Ravi, A; et al., "A 2.4-GHz 2040-MHz Channel WLAN Digital Outphasing Transmitter Utilizing a Delay-Based Wideband Phase Modulator in 32-nm CMOS," IEEE J. Solid-State Circuits, vol. 47, No. 12, pp. 3184,3196, Dec. 2012.
S. Chung, P. Godoy, T. Barton, D. Perreault and J. Dawson, "Asymmetric multilevel outphasing transmitter using class-E PAs with discrete pulse width modulation", 2010 IEEE MTT-S International Microwave Symposium, 2010.
S. Chung, R. Ma, K. Teo and K. Parsons, "Outphasing multi-level RFPWM signals for inter-band carrier aggregation in digital transmitters", 2015 IEEE Radio and Wireless Symposium (RWS), 2015.
S. Henzler, S. Koeppe, D. Lorenz, W. Kamp, R. Kuenemund and D. Schmitt-Landsiedel, "A Local Passive Time Interpolation Concept for Variation-Tolerant High-Resolution Time-to-Digital Conversion", IEEE Journal of Solid-State Circuits, vol. 43, No. 7, pp. 1666-1676, 2008.
S. Kulkarni et al., "Multi-standard wideband OFDM RF-PWM transmitter in 40nm CMOS", ESSCIRC Conference 2015—41st European Solid-State Circuits Conference (ESSCIRC), pp. 88-91, 2015.
T. Kodera, N. Ando, and M. Taromaru, "A basic study on EER transmitter with burst-width envelope modulation based on triangle-wave PWM," in Proc. Korea-Japan Microwave Conf., Nov. 2007, pp. 14.

* cited by examiner

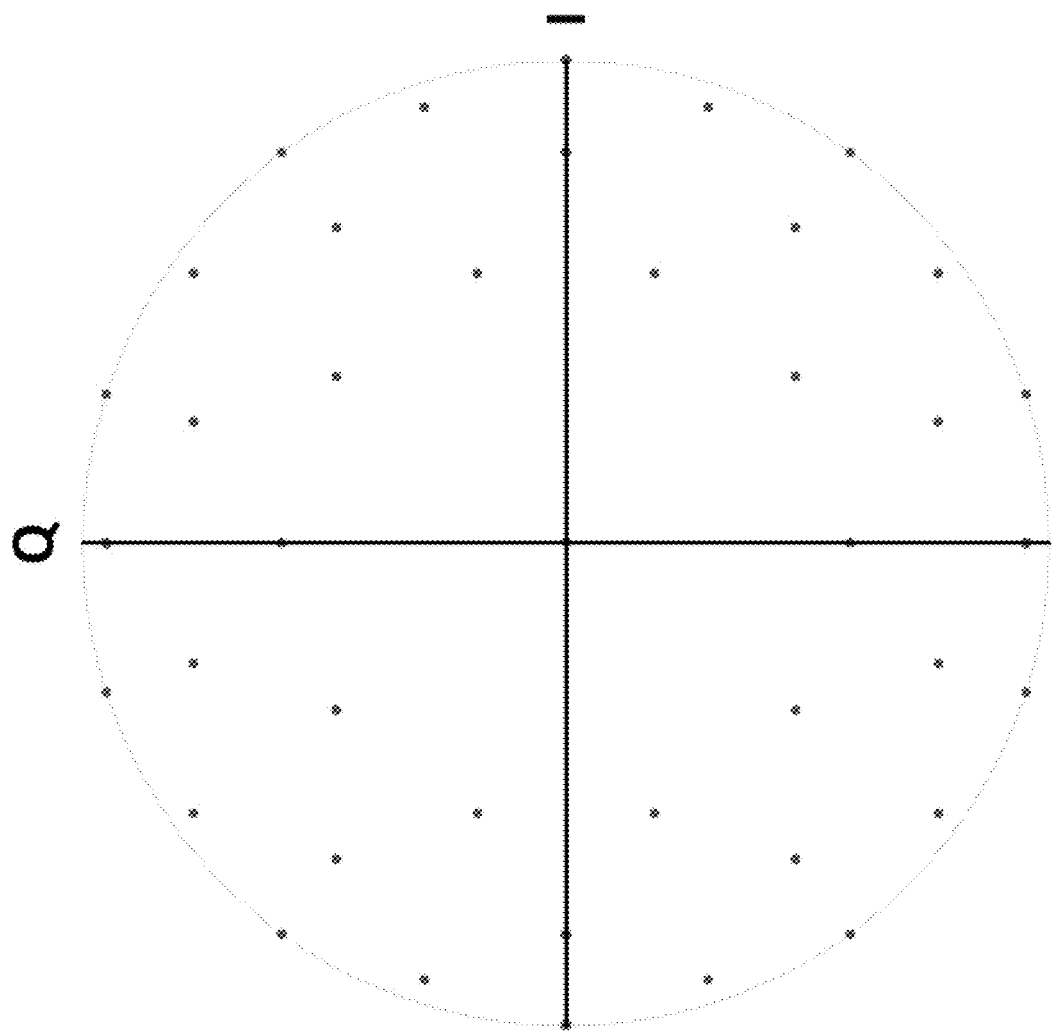

SYSTEM AND METHOD FOR IMPROVED RF PULSE WIDTH MODULATION

CROSS-REFERENCE TO RELATED APPLICATIONS

This application claims priority to U.S. Provisional Patent Application No. 62/964,288, filed on Jan. 22, 2020, incorporated herein by reference in its entirety.

STATEMENT REGARDING FEDERALLY SPONSORED RESEARCH OR DEVELOPMENT

This invention was made with government support under D16AP00094 awarded by the Defense Advanced Research Projects Agency. The government has certain rights in the invention.

BACKGROUND OF THE INVENTION

Digital transmitters offer frequency flexibility, process, voltage, and temperature (PVT) tolerance, and benefit from technology scaling. Despite all these advantages, they still have not gained widespread commercial deployment. One of the reasons for this is because of the inherent dynamic range limitations of the most popular method by which polar modulators generate their amplitude modulation. This method is known as RF Pulse Width Modulation (RFPWM) and is accomplished by ANDing two phase shifted copies of a 50% duty cycle square wave carrier, with a system similar to that shown in FIG. 1. Unfortunately, RFPWM's achievable amplitude has an inherent lower bound due to pulse width distortion and pulse swallowing. The bound for an RFPWM system's dynamic range also decreases with the carrier frequency. This means that traditional RFPWM systems are often not suitable for transmitting high peak-to-average power ratio (PAPR) communication standards such as WLAN.

Pulse swallowing occurs when the desired pulse width is less than the rise time of the circuit. When this occurs, the circuit's output does not make the transition to a full logical high before the changing input state forces the output back to logical low. Because the output never reaches a full logical high, logic downstream will simply interpret this signal as a constant logical low. Even if the desired pulse width is greater than the rise time, small pulse widths suffer from high levels of distortion and sensitivity to clock jitter.

In addition to limited dynamic range, RFPWM systems also suffer from limited resolution. Because RFPWM requires ANDing together two phase-shifted RF waveforms, the total number of amplitude quantizations that can be achieved via pulse width modulation is equal to the number of phase quantizations that can be generated between 0° and 180°. At RF frequencies, it can be difficult to generate more than a few quantizations, especially if the phase shifter requires wideband reconfigurability. This can be alleviated by the use of various types of phase interpolator units, which are generally a variation of a resistive interpolator. Unfortunately, for adequate resolution, typically hundreds or thousands of these interpolator units are required, which makes the circuit highly sensitive to PVT and consumes significant area and power. Furthermore, the matching of many of these interpolator units requires matching of a combination of resistors, capacitors, and/or transistors. Because the process variations in each of these device types is largely uncorrelated, the variation in interpolators using a combination of device types is expected to result in lower yields. Alternatively, a two-step gross/fine phase shift architecture can be used. However, doing so can yield nonlinearities and non-uniformly spaced phase quantizations if not well-calibrated. Furthermore, this method does nothing to mitigate the dynamic range limitations associated with pulse swallowing.

Previous works have attempted to address the dynamic range issues caused by pulse swallowing. This has been accomplished primarily through the use of multilevel outputs, supply modulation, and/or multiple PAs/outphasing. Unfortunately, these techniques do not generally scale well. In particular, there is a practical limit to the number of power amplifiers (PAs) that can be combined, as well as the fact that combiners occupy large areas and introduce significant loss, thus degrading the PA efficiency. Multilevel outputs also do not scale well for the same reasons, as well as the fact that they are not compatible with standard binary circuits. Similarly, outphasing circuitry occupies significant area and introduces loss due to the power combiners required.

Another method of extending dynamic range is carrier switching, which transmits the second harmonic of half the carrier frequency to achieve low amplitudes. However, existing carrier switching methods still require a very high number of devices to be matched to one another (422 devices and 72 interpolators as described in K. Cho et al., "A Digitally Intensive Transmitter/PA Using RF-PWM With Carrier Switching in 130 nm CMOS", IEEE Journal of Solid-State Circuits, vol. 51, no. 5, pp. 1188-1199, 2016, incorporated herein by reference).

Yet another dynamic range enhancement method is carrier bursting, also known as Baseband PWM (BBPWM) or burst-width modulation. In BBPWM, a carrier is turned on and off at a variable duty cycle with a switching frequency much smaller than the carrier frequency. By adjusting the ratio of on to off time, the modulator is able to generate amplitude modulation. However, the phase resolution of BBPWM systems is still limited by phase modulator quantization, and therefore still requires phase interpolator units.

Thus, there is a need in the art for an improved system of RFPWM that allows for enhanced dynamic range in a low-power, simple architecture that allows for good signal fidelity. The present invention satisfies that need.

SUMMARY OF THE INVENTION

In one aspect, a system for generating an RFPWM signal comprises a delta sigma modulator having a plurality of outputs, a phase-locked loop comprising a plurality of phase quantization outputs, at least one multiplexer having a plurality of signal inputs, a plurality of selector inputs, and at least one output, the signal inputs communicatively connected to the phase quantization outputs of the phase-locked loop and the selector inputs electrically connected to the outputs of the delta sigma modulator, and a driver having an input communicatively connected to the output of the multiplexer and an output generating an RFPWM signal.

In one embodiment, the at least one multiplexer comprises at least two multiplexers, and further comprising an AND gate with inputs connected to the outputs of the multiplexers and an output connected to the input of the driver. In one embodiment, the plurality of phase quantization outputs is at least five. In one embodiment, the delta sigma modulator is a correlated delta sigma modulator. In one embodiment, the correlated delta sigma modulator comprises at least two delta sigma modulators and a counter. In one embodiment, the system further comprises a plurality of buffers electrically connected to the phase quantization outputs and the multiplexer signal inputs.

In one embodiment, the system further comprises a plurality of inverters electrically connected to the phase quantization outputs and the multiplexer signal inputs. In one embodiment, the system further comprises a voltage-controlled oscillator connected to the delta sigma modulator. In one embodiment, a frequency of the voltage-controlled oscillator is in a range from 100 MHz to 1.2 GHz. In one embodiment, the system is configured to deliver a dynamic range of at least 20 dB. In one embodiment, the system is configured to deliver a dynamic range of at least 30 dB.

In another aspect, a method of generating an RFPWM signal comprises providing a correlated delta sigma modulator having a plurality of outputs, generating a plurality of phase quantizations with a phase-locked loop, driving a plurality of selector inputs of at least one multiplexer with the plurality of delta sigma modulator outputs to select at least one phase quantization as an output to the multiplexer, and generating an RFPWM output signal from the output of the multiplexer.

In one embodiment, the method further comprises the step of alternating between at least two phase quantizations to generate an average effective phase having a phase value between the at least two phase quantizations. In one embodiment, the method comprises generating the plurality of phase quantizations in increments of at most $\pi/5$. In one embodiment, the method comprises generating the plurality of phase quantizations in increments of at most $\pi/8$. In one embodiment, the method comprises modifying one or more parameters of the phase-locked loop and changing the plurality of phase quantizations. In one embodiment, the method comprises driving a plurality of selector inputs of at least two multiplexers.

In one embodiment, the method comprises combining at least one output from each of the at least two multiplexers with a logic gate. In one embodiment, the logic gate is an AND gate. In one embodiment, the method comprises driving an input of a driver with the output of the multiplexer.

BRIEF DESCRIPTION OF THE DRAWINGS

The foregoing purposes and features, as well as other purposes and features, will become apparent with reference to the description and accompanying figures below, which are included to provide an understanding of the invention and constitute a part of the specification, in which like numerals represent like elements, and in which:

FIG. 6 is a graph of I/Q constellation points without interpolation.

DETAILED DESCRIPTION

Figure 1:
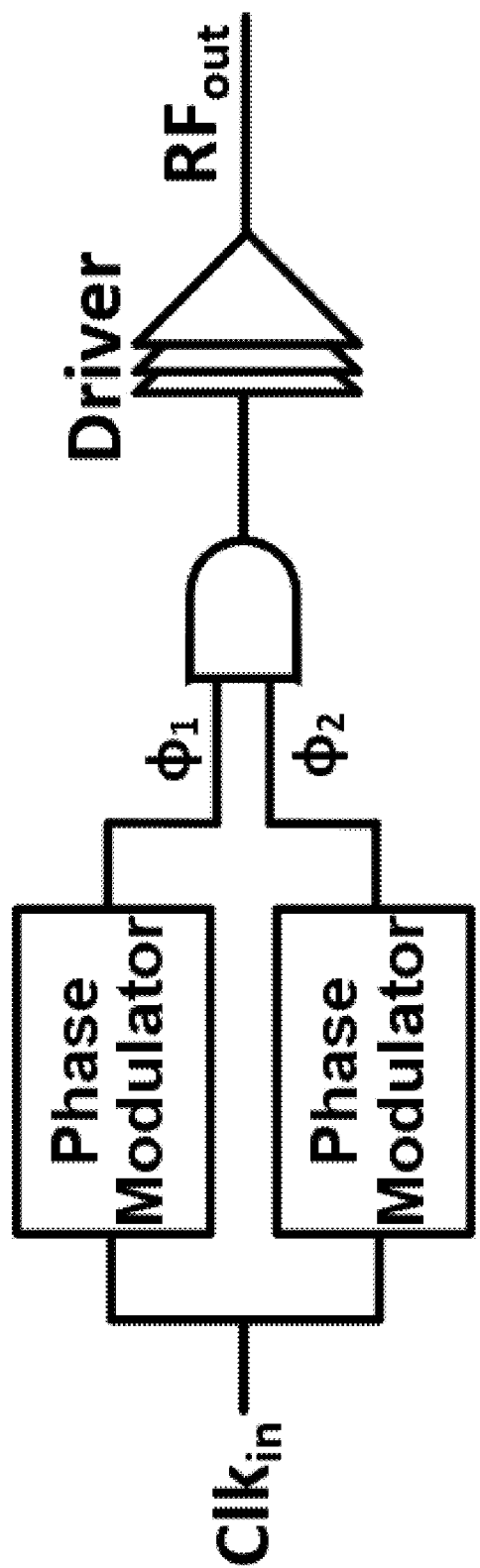
FIG. 1 is an exemplary RFPWM structure.

It is to be understood that the figures and descriptions of the present invention have been simplified to illustrate elements that are relevant for a clear understanding of the present invention, while eliminating, for the purpose of clarity, many other elements found in related systems and methods. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

In some aspects of the present invention, software executing the instructions provided herein may be stored on a non-transitory computer-readable medium, wherein the software performs some or all of the steps of the present invention when executed on a processor.

Aspects of the invention relate to algorithms executed in computer software. Though certain embodiments may be described as written in particular programming languages, or executed on particular operating systems or computing platforms, it is understood that the system and method of the present invention is not limited to any particular computing language, platform, or combination thereof. Software executing the algorithms described herein may be written in any programming language known in the art, compiled or interpreted, including but not limited to C, C++, C#, Objective-C, Java, JavaScript, Python, PHP, Perl, Ruby, or Visual Basic. It is further understood that elements of the present invention may be executed on any acceptable computing platform, including but not limited to a server, a cloud instance, a workstation, a thin client, a mobile device, an embedded microcontroller, a television, or any other suitable computing device known in the art.

Parts of this invention are described as software running on a computing device. Though software described herein may be disclosed as operating on one particular computing device (e.g. a dedicated server or a workstation), it is understood in the art that software is intrinsically portable and that most software running on a dedicated server may also be run, for the purposes of the present invention, on any of a wide range of devices including desktop or mobile devices, laptops, tablets, smartphones, watches, wearable electronics or other wireless digital/cellular phones, televisions, cloud instances, embedded microcontrollers, thin client devices, or any other suitable computing device known in the art.

Similarly, parts of this invention are described as communicating over a variety of wireless or wired computer networks. For the purposes of this invention, the words "network", "networked", and "networking" are understood to encompass wired Ethernet, fiber optic connections, wireless connections including any of the various 802.11 standards, cellular WAN infrastructures such as 3G or 4G/LTE networks, Bluetooth®, Bluetooth® Low Energy (BLE) or Zigbee® communication links, or any other method by which one electronic device is capable of communicating with another. In some embodiments, elements of the networked portion of the invention may be implemented over a Virtual Private Network (VPN).

Figure 2:
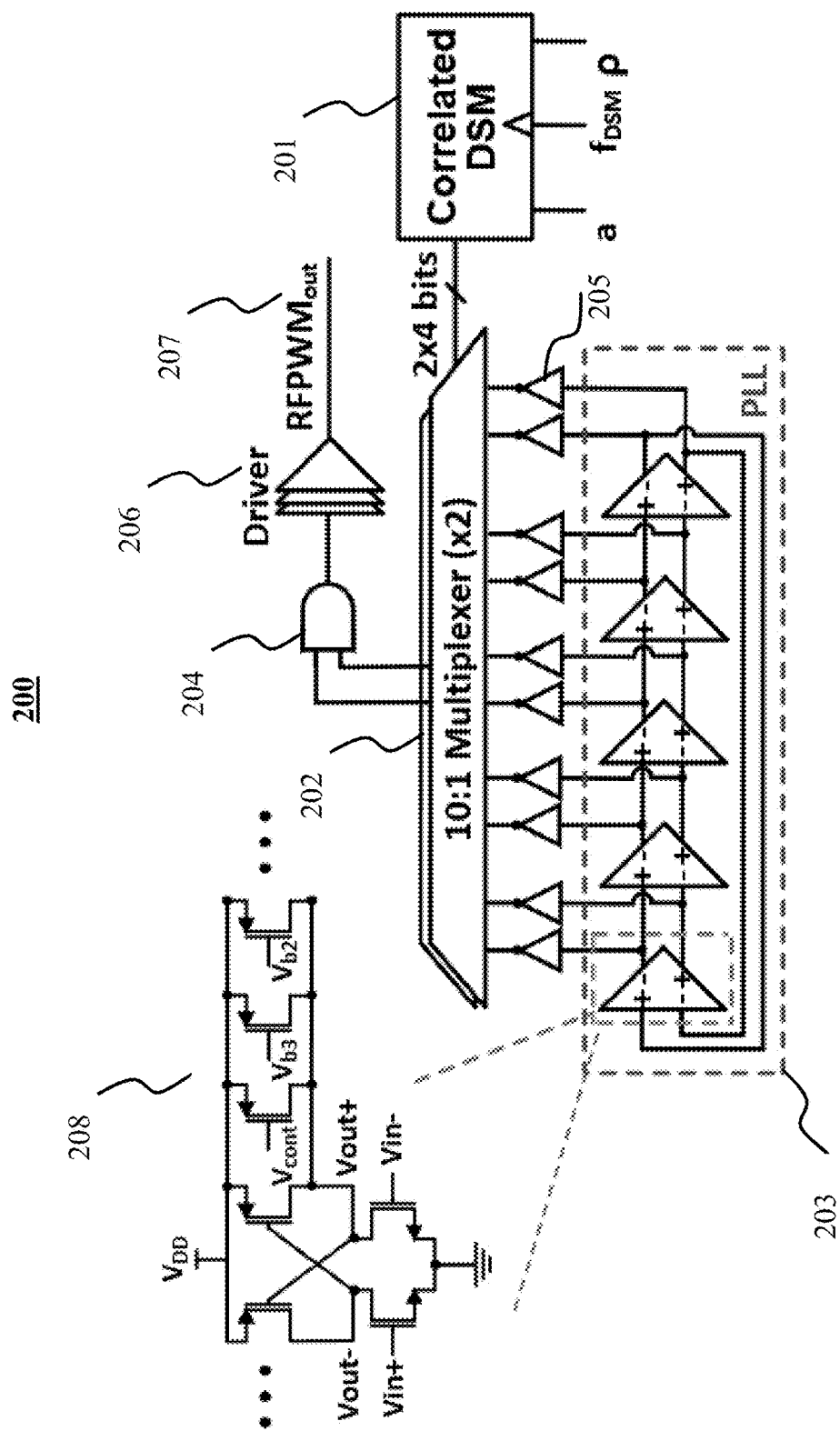
FIG. 2 is an exemplary RFPWM device of the present disclosure.

An exemplary device of the present invention is shown in FIG. 2. The depicted device alleviates issues related to both dynamic range and limited resolution. The depicted system functions as an RFPWM only within the range for which pulse swallowing is not an issue (i.e. 20-50% duty cycle). Below this threshold, the system will limit the output to pulses of width 20%, but will purposefully swallow a certain portion of the pulses. This allows the system to always transmit pulses of sufficient width to avoid amplitude distortion, but allows the amplitude of the fundamental frequency to be linearly decreased as a function of the ratio of swallowed to non-swallowed pulses. This ratio is controlled by a first-order digital Delta-Sigma modulator ($\Delta\Sigma M$). Additionally, the depicted system requires only the single $\Delta\Sigma$ interpolator unit, thus mitigating the PVT sensitivity, power, and area increases associated with large numbers of interpolator units.

Figure 3:
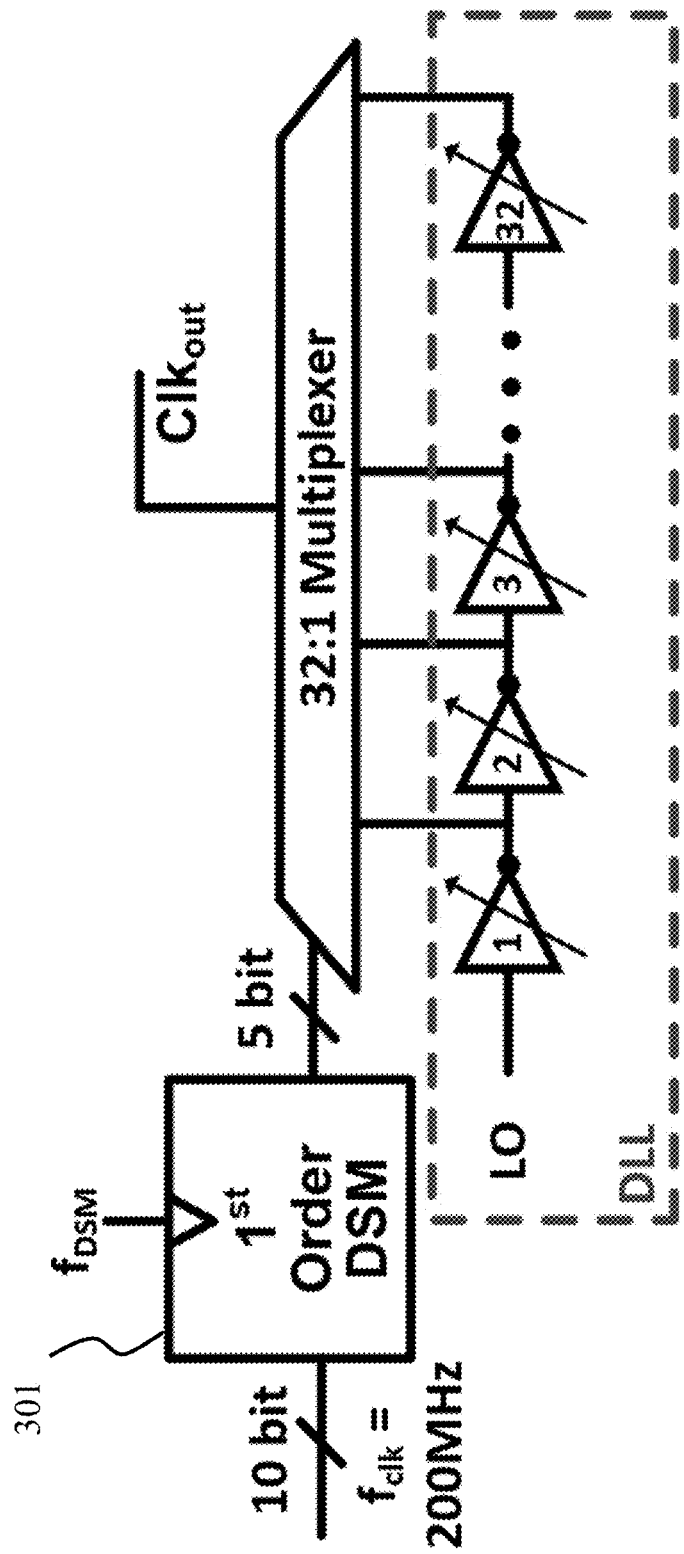
FIG. 3 is an existing RFPWM architecture.

The use of a $\Delta\Sigma M$ to interpolate phase from gross quantizations has been proposed before, for example in H. Gheidi et al., "A 13 GHz DeltaSigma-Based Closed-Loop Fully Digital Phase Modulator in 45-nm CMOS SOT", IEEE Journal of Solid-State Circuits, vol. 52, no. 5, pp. 1185-1195, 2017, incorporated herein by reference. However, the authors Gheidi used a single $\Delta\Sigma$ 301 to interpolate the phase of a single waveform as shown in FIG. 3. As such, it is only capable of transmitting constant amplitude waveforms unless a separate amplitude modulator is added to the system. The disclosed system shows that adding correlated $\Delta\Sigma$ interpolation to both inputs of an RFPWM waveform generator allows not only fine phase resolution, but allows significantly greater dynamic range than is otherwise possible with a standalone RFPWM.

The output amplitude and phase of a RFPWM system are determined by the two phase shifts at the input, $\phi_1$ and $\phi_2$ such that:

$$A_i = \sin\left(\frac{\pi}{2} - \frac{\phi_1 - \phi_2}{2}\right) \qquad \text{Equation 1}$$

$$\theta = \frac{\phi_1 + \phi_2}{2} \qquad \text{Equation 2}$$

Because the output amplitude is a function of the sine of the duty cycle, it is expected that the transfer characteristics should be nearly linear at low amplitudes, but suffer from nonlinear gain compression at high amplitudes. Unfortunately, the pulse swallowing occurs in the low amplitude region, where the linearity is best. Because of the nonlinearity in both regions of operation, the RFPWM architecture is significantly limited in its possible dynamic range and PAPR values.

With reference now to FIG. 2, a simplified schematic of a system 200 of the present disclosure is shown. In this architecture, a $\Delta\Sigma M$ 201 controls the select signal of the one or more multiplexers 202. By switching between the possible phases at a rate much faster than the signal bandwidth, the presented system is capable of generating a waveform whose average amplitude and phase are equal to the desired waveform. In some exemplary embodiments, the disclosed system switches between the phases at a rate between 2 and 100 times the signal bandwidth, or between 2 and 50 times the signal bandwidth, or between 2 and 20, or between 2 and 10, or between 2 and 5, or between 3 and 6 times the signal bandwidth. In some embodiments, the disclosed system switches between phases at five times the signal bandwidth, or ten times the signal bandwidth. As would be understood by one skilled in the art, the listed $\Delta\Sigma M$ sampling frequencies are not meant to be limiting, and any suitable sampling frequency inside or outside the specified ranges may be used. The depicted multiplexer 202 is a set of two 10:1 multiplexers, but it is understood that other values of multiplexer may be used, for example 4:1, 5:1, 8:1, 16:1, 20:1, 32:1, or any other suitable value. In some embodiments, one multiplexer may be used, while in other embodiments, more than two multiplexers may be used.

In some embodiments, the phase outputs of PLL 203 are run through inverters and/or buffers 205 before passing into one or more multiplexers 202.

$$\left(0, \frac{\pi}{5}, \frac{2\pi}{5} \ldots \right),$$

The depicted PLL 203 outputs 10 uniform phase quantizations although in designs using other values of multiplexer, the PLL may be configured to output more or fewer uniform phase quantizations. In some embodiments the phase quantizations fed into the multiplexer by the PLL are uniform, but in other embodiments, one or more of the phase quantizations may not be uniform. To transmit a given phase, the ΔΣM alternates between the next highest and next lowest phase quantizations from the desired phase, thus producing an average effective phase. For example, if $\phi_1$ was desired to be $$\frac{\pi}{10},$$

the phase shifter would alternate between quantizations 0 and $$\frac{\pi}{5}$$

with equal dwell times. The effective phase can be stated mathematically as $$\theta_{eff} = \frac{\phi_1 + (1-a_1)\frac{\pi}{5} + \phi_2 + (1-a_2)\frac{\pi}{5}}{2} \quad \text{Equation 3}$$

Where $a_1$ and $a_2$ are weighing factors from 0 to 1 describing how often the higher phase is output. Although in the depicted embodiment the phase quantizations available are separated in increments of $$\frac{\pi}{5},$$

it is understood that order increments may be used depending on the configuration and clock speeds available. Alternative suitable increments include, but are not limited to $$\frac{\pi}{8}, \frac{\pi}{10}, \frac{\pi}{16}, \frac{\pi}{20}, \frac{\pi}{32}, \frac{\pi}{64},$$

or any other suitable value. In some embodiments, the phase quantization increments may vary over time. In some embodiments, the phase quantizations are generated in increments of at most π/2, at most π/5, at most π/8, or at most π/10. As would be understood by those skilled in the art, available phase quantizations are determined by the oscillator used and the degree of phase interpolation available. In some embodiments, an architecture of the present disclosure may include one or more additional multiplier elements, for example phase interpolators.

In some embodiments, certain components of the circuit, including but not limited to the PLL, ΔΣM and/or multiplexer may be implemented using a field-programmable gate array (FPGA) or other reconfigurable circuit. In these or other embodiments, the phase quantization increments may be varied during operation of the device, for example by modifying one or more parameters of the PLL and/or multiplexer to provide different timing signals.

To generate the amplitude modulation, two of these phase shifted waveforms are ANDed together with AND gate 204. The AND output is then used as an input to driver 206 to produce output signal 207. Because the waveforms have independent phase shifts, they will take on one of two amplitudes, depending on whether both phase quantizations are rounded in the same direction or not. If the two phases are rounded in the same direction, there is no change in fundamental amplitude $$A = \sin\left(\frac{\pi}{2} - \frac{\phi_1 - \phi_2}{2}\right) \quad \text{Equation 4}$$

whereas if only $\phi_1$ is rounded up, the fundamental amplitude would be $$A = \sin\left(\frac{\pi}{2} - \frac{\phi_1 + \frac{\pi}{5} - \phi_2}{2}\right) \quad \text{Equation 5}$$

Assuming $a_2$ is zero, the average amplitude would be $$A_{eff} = \sin\left(\frac{\pi}{2} - \frac{\phi_1 + (1-a_1)\frac{\pi}{5} - \phi_2}{2}\right) \quad \text{Equation 6}$$

Similar results would be yielded if $a_1$ was set to zero instead of az.

Another useful case is when $a_1$ and $a_2$ are identical. This can be done by having both multiplexer selector inputs (sometimes referred to herein as "selector words") driven by the same ΔΣM. In this case, there will always be the same amount of overlap between the two ANDed waveforms. Thus, the amplitude reduces to Equation 1, which is constant for a given value of $\phi_1$ and $\phi_2$. This means that phase modulation can be done independently of amplitude modulation.

Intermediate states where $a_1$ and $a_2$ are partially dependent also exist. To facilitate this, a new variable, ρ is introduced. $a_2$ can then be defined such that it is equal to $a_1$, but with (1-ρ)*100% of the ones are replaced with zeros. For example, when ρ is equal to 0.5, half of $a_2$'s ones are set to zero. This case would yield an amplitude halfway between Equation 1 and Equation 6. This can be extended to arbitrary values p.

$$A_{eff} = \sin\left(\frac{\pi}{2} - \frac{\phi_1 + \rho(1-a_1)\frac{\pi}{5} - \phi_2}{2}\right) \quad \text{Equation 7}$$

Because ρ and $a_1$ can be set independently, this allows amplitude and phase to be set independently. A graphic description of the effects of ρ is provided in FIG. 4. In this plot, the blue data points 401 correspond to I/Q values that are achievable without interpolation where $\phi_1$ and $\phi_2$ are set to combinations of 0 and $$\frac{\pi}{5}.$$

The vectors correspond to the resulting I/Q points for increasing values of $a_1$. As can be seen, by varying the value of ρ, the system can generate any arbitrary I/Q point within the polyhedra formed by the three vertices. This same behavior can be repeated for each possible combination of $\phi_1$ and $\phi_2$ values to cover the entire I/Q space. The region of operation where these relations are true will be referred to throughout this text as "pulse width mode" or "pulsewidth mode" because it is the region of operation where all amplitude modulation is generated by pulse width modulation.

Figures 5A, 5B:
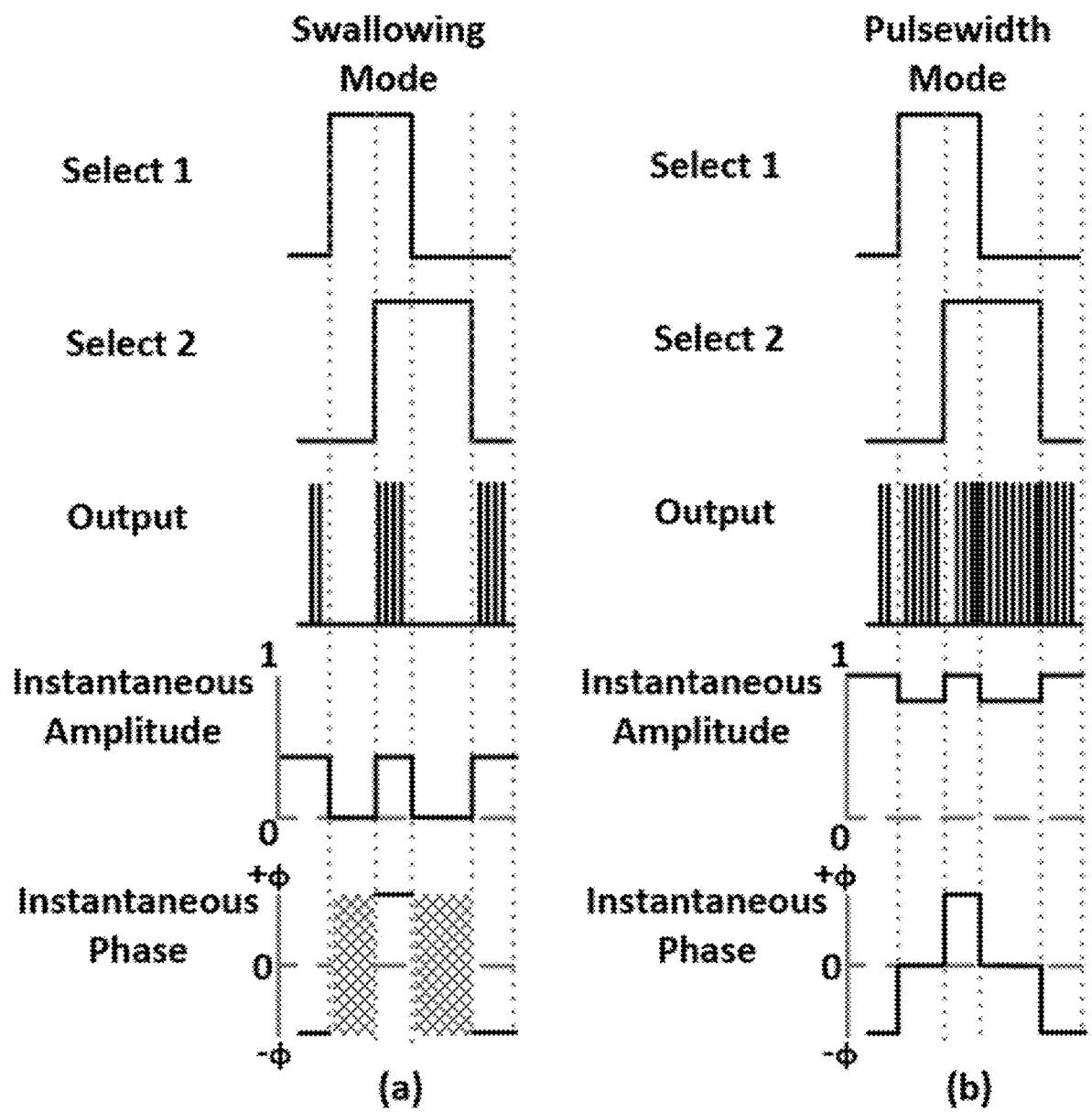
FIG. 5A is a graphical time domain example of pulse swallowing mode.
FIG. 5B is a graphical time domain example of pulse width mode.

This system takes on an interesting characteristic when the desired amplitude is below the pulse-swallowing threshold. This mode of operation is referred to as "swallowing mode." The differences between pulse width mode and swallowing mode are highlighted in FIG. 5A and FIG. 5B. As can be seen in FIG. 5A, the swallowing mode only has valid outputs when the two multiplexer selects are different. This is in contrast to the pulse width mode shown in FIG. 5B, where there are always pulses of a valid width, and the amplitude is controlled by the width of the pulses. Furthermore, it can be seen that in the swallowing mode, there is no phase listed when the two multiplexer select bits are different, because phase is meaningless when the amplitude is zero. The larger gaps and nearly overlapping pulses near transitions shown in the output of FIG. 5B are representative of phase shifts in the time domain. These shifts are not to scale, but are highly exaggerated to be easily visible in the figure.

Figure 4:
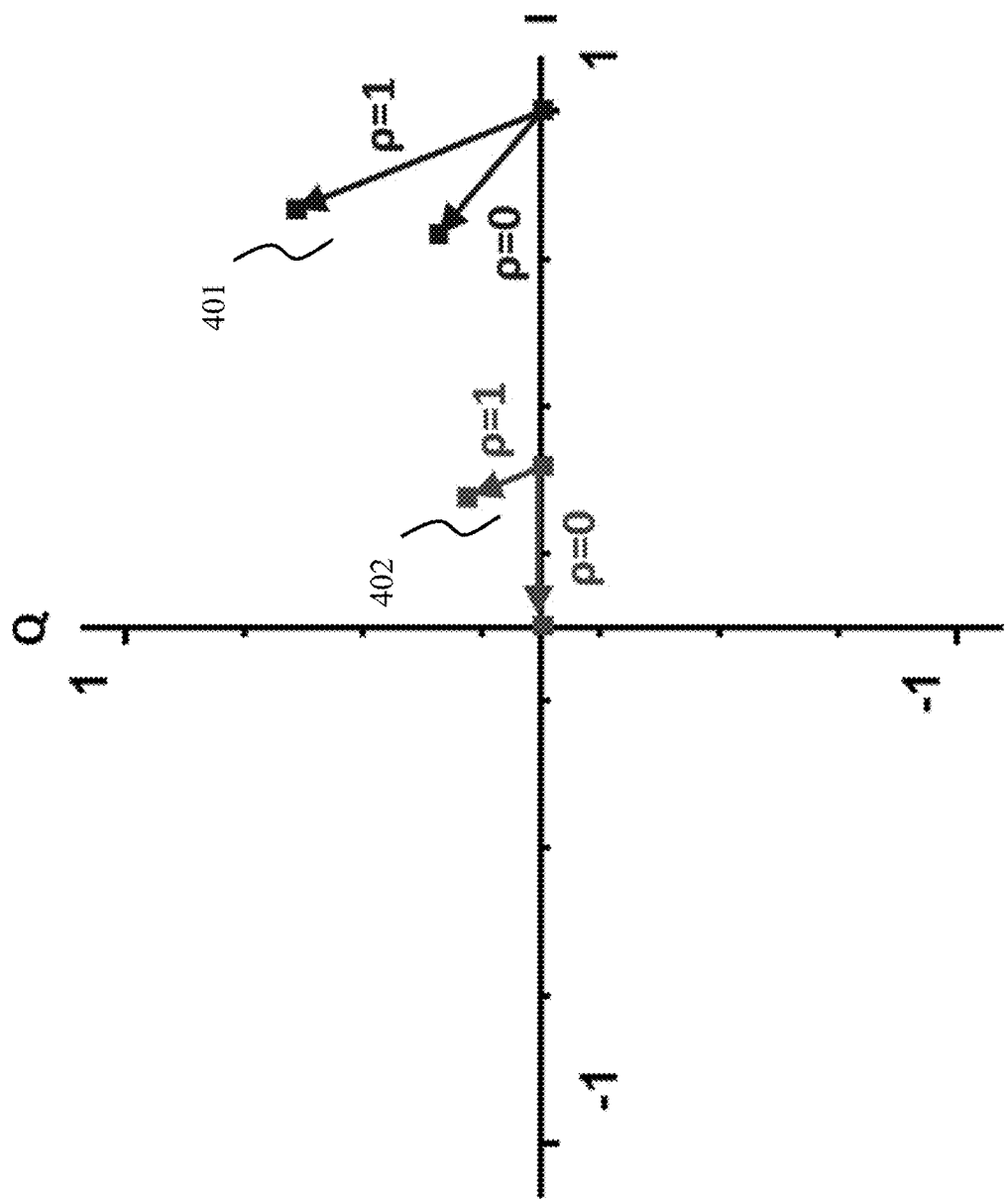
FIG. 4 is a graphical demonstration of coefficients.

A graphical example of how the I/Q outputs are affected by a and $\rho$ in the swallowing mode is also shown in FIG. 4. In this portion of the plot, the red data points 402 correspond to I/Q values that are achievable without interpolation where $\phi_1$ and $\phi_2$ are set to combinations of 0 and $$\frac{4\pi}{5}.$$

In this case, any pulses where both phases are rounded in the same direction are swallowed and contribute no power to the fundamental frequency. However, when only one phase is rounded up, the pulse is not swallowed. Assuming $a_2$ is set to zero, the effective amplitude then becomes $$A_{eff} = a_1 \sin\left(\frac{\pi}{2} - \frac{\phi_1 + \frac{\pi}{5} - \phi_2}{2}\right) \qquad \text{Equation 8}$$

A similar reliance on $\rho$ exists here as well. By using $a_1$ as a multiplicative factor, the system can generate waveforms with arbitrarily small fundamental amplitudes by using arbitrarily small values for $a_1$. This does not affect the maximum output amplitude, which has been normalized to 1 throughout the derivations. Thus, it can be seen that the achievable PAPR of the disclosed architecture is limited only by the minimum size of $a_1$. When controlled by a first order $\Delta\Sigma$M, as shown above, the minimum value of $a_1$ is defined by the length of the digital control word of the $\Delta\Sigma$M.

The disclosed system uses a total of 10 phase quantizations, where pulse swallowing occurs if the pulse is less than 72 degrees (duty cycle of 20%). Without interpolation, the disclosed system is capable of generating the constellation shown in FIG. 6. As can be seen, the dynamic range and total number of points is insufficient to transmit a 64QAM waveform. This clearly demonstrates the necessity of interpolators for RFPWM systems.

Figure 7:
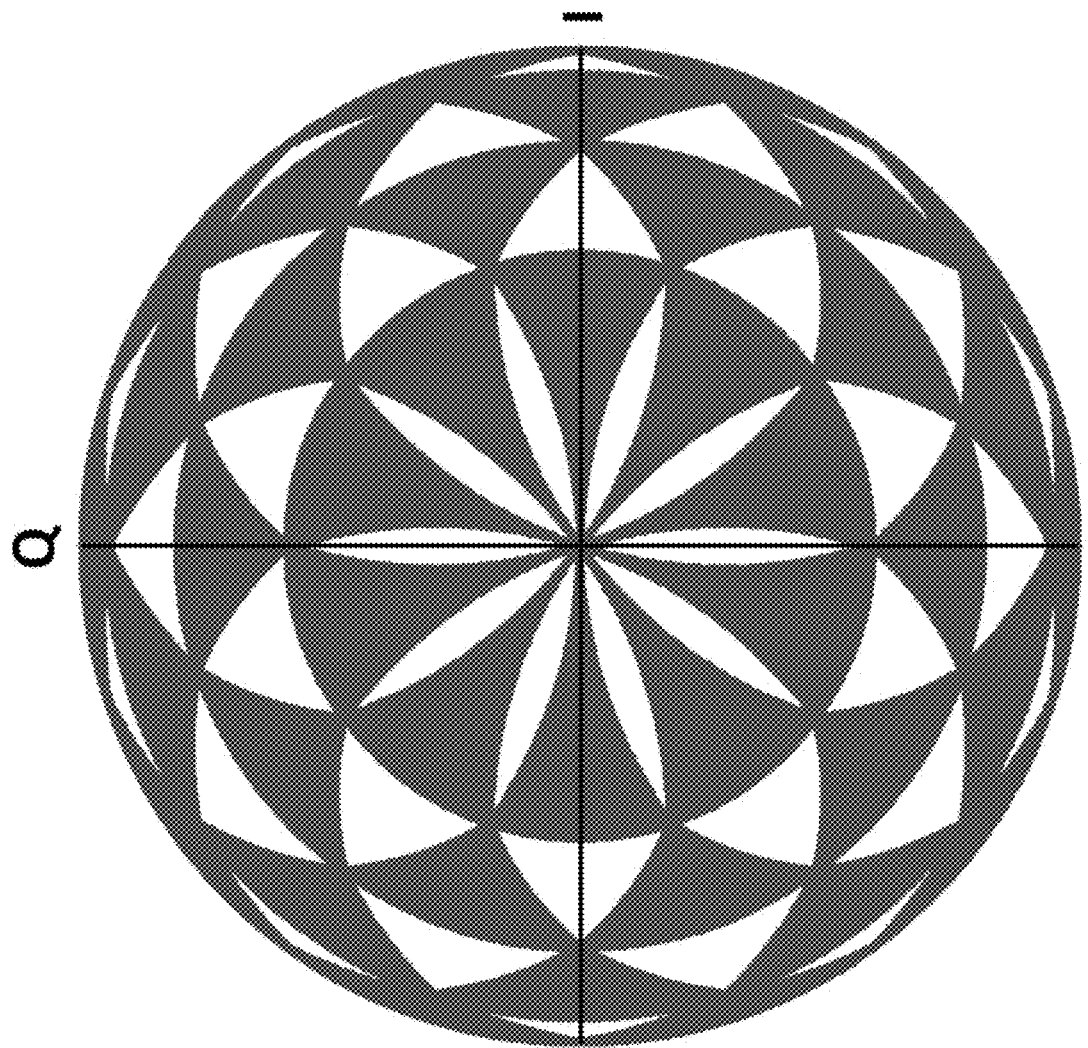
FIG. 7 is a graph of I/Q constellation points with interpolation.

Using the presented relations between $a_1$ and $\rho$, a MATLAB™ script was used to generate a plot of the possible I/Q outputs when the presented system utilizes its $\Delta\Sigma$ interpolators. The results of this simulation are plotted in blue in FIG. 7. This script assumes that both $a_1$ and $\rho$ are represented as 5 bit binary values. In reality, the presented system uses 8 bits of resolution. However, it will be shown in the Experimental Examples that close-in spurs result from using these least significant bits (LSBs). While truncating these last three bits of $a_1$ and p represents an overall loss of resolution, it can be seen in FIG. 7 that the disclosed system (with truncation) is still capable of covering a much larger portion of the I/Q space. It should be noted that each dead zone's outermost vertex is one of the original constellation points. Therefore, there is one deadzone shape for each I/Q point that was possible without interpolation, yielding a total of 10 deadzone shapes per concentric ring of amplitude. A system with a more than 10 quantizations would yield more, but smaller, dead zone shapes.

These dead zone shapes can be intuitively explained as follows: assume there is a gross quantization at some phase, $\phi_x$. If this phase is ANDed with itself it will yield an amplitude of 1. To achieve amplitudes of less than 1, two phases, $\phi_y$ and $\phi_z$, where y≠z, must be ANDed together. The conditions that generate the maximum possible amplitude, while maintaining the same phase as $\phi_x$ is the case where $\phi_y=\phi_x$ and $\phi_z=\phi_{x-1}$ with $a_1=0.5$ and $\rho=1$. These inputs mean that the $\Delta\Sigma$ will alternate between outputs with constant amplitude 0.95 and phase $\phi_x$ 18 degrees with a 50% duty cycle. This results in an average waveform with amplitude 0.95 and phase $\phi_x$. Because this is the maximum achievable amplitude (aside from the original quantization) it follows that there will be a dead zone between 0.95 and 1 at the original quantization point's phase. This same argument can be extended to each original quantization point to find the vertices of the dead zones.

Figure 9:
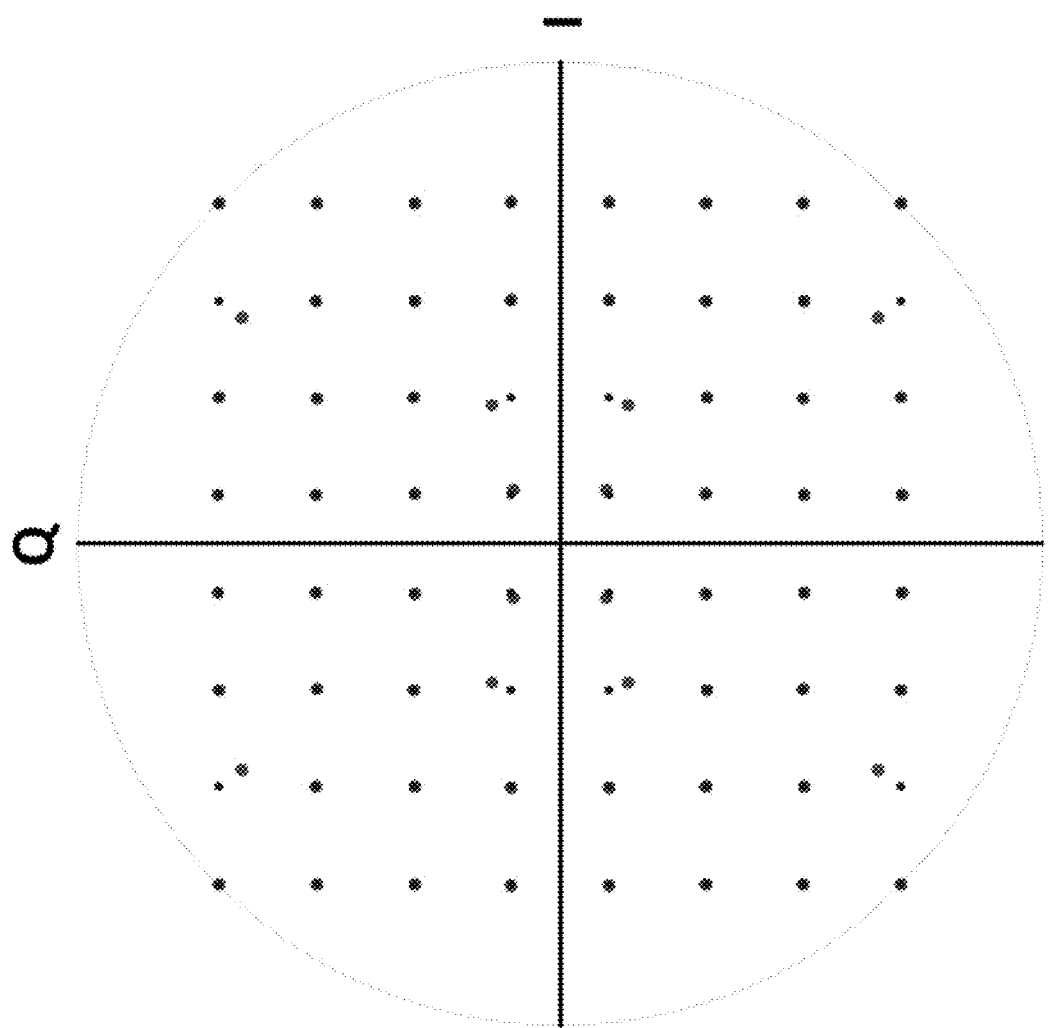
FIG. 9 is an I/Q graph of a 64 QAM constellation.

FIG. 9 presents the ideal constellation that could be generated by the presented system in red. An ideal 64QAM constellation without any distortion is superimposed in blue. It can be seen that this constellation yields some level of distortion due to the dead zones shown in FIG. 7. This distortion is primarily present at 8 particular points, while the remaining 56 have non-discernible levels of distortion. The overall average error vector magnitude (EVM) associated with these distortions is only 0.8-1.0%, depending on the rotation of the constellation. The particular case shown in FIG. 9 corresponds to an EVM of approximately 0.8%. This EVM will add geometrically to the EVM due to random errors (i.e. noise). That is to say, the total EVM will be $$\text{EVM}_{total} = \sqrt{0.8^2 + \text{EVM}_{noise}^2} \qquad \text{Equation 9}$$

Bandwidth

While the minimum amplitude of the output is theoretically set by the smallest value of $a_1$, the disclosed device must also consider bandwidth constraints. If a given symbol being transmitted has a duration of n pulses, the minimum amplitude could be no less than $$\frac{A_s}{n},$$

where $A_s$ is the amplitude of the smallest un-swallowed pulse. This is because at least one pulse must be transmitted during the symbol. More realistically, it is advised to have at least five or ten times this in order to achieve a reasonable error vector magnitude. This means that the overall accuracy of the system is defined in part by the clocking speed of the ΔΣM. However, there is a fundamental limit to how fast the ΔΣM can be clocked. Because phase information lies only in the edges of the pulses, sampling at a rate higher than twice the carrier frequency ($2*f_{carrier}$) yields no marginal improvement. It was also observed during the design process that rates above approximately $0.5f*_{carrier}$ yielded minimal EVM improvement, but generated large spurs at the output. As such, the ΔΣM clocking frequency is set to operate in the range of 100 MHz to 1.2 GHz.

For the following examples, an output frequency of 1.6 GHz, ΔΣ sampling frequency of $f_{carrier}/2$ (800 MHz), and instantaneous bandwidth of 10 MHz is assumed. These numbers are arbitrary examples, and can be adjusted without loss of generality. If the ΔΣ samples at a rate of 800 MHz for a waveform with 10 MHz instantaneous bandwidth, then there are a total of 80 ΔΣ transitions per symbol. It was noted above that the last two bits of co were truncated to reduce spur levels. This means the minimum achievable amplitude is 5% of the minimum amplitude needed for 64 QAM, which implies there is significant margin in the dynamic range, even with 2 bits of truncation.

EVM

The instantaneous bandwidth is also expected to degrade the EVM due to amplitude errors in the swallowing region. These errors will occur for any constellation point whose amplitude is less than the amplitude of the smallest swallowed pulse (assumed to be 0.59). The smallest desired amplitude in a 64 QAM constellation is approximately 0.14. This corresponds to transmitting during 19 of the 80 ΔΣ sampling cycles. However, because the ΔΣ has a (truncated) length of 6 bits, is expected to repeat every 64 cycles, whereas a symbol has a length of 80 cycles. Because the maximum ΔΣ pattern length is different than the symbol length, it is possible that the number of transmitted cycles is one higher than desired. The average error ε is defined by the marginal error introduced by an additional cycle of transmitted amplitude, multiplied by the probability that an extra cycle will occur. The actual pattern time of the ΔΣ is $$t_{\Delta\Sigma} = \pm \frac{GCD(code, code_{max})}{code_{max} f_{\Delta\Sigma}} \quad \text{Equation 10}$$

but will be approximated as $$t_{\Delta\Sigma} = a_1 f_{\Delta\Sigma} \quad \text{Equation 11}$$

with this simplification, the error can be expressed as $$\varepsilon = \frac{0.59 BW}{a_1 f_{\Delta\Sigma}} \cdot \text{rem}\left(\frac{\frac{1}{BW}}{\frac{1}{a_1 f_{\Delta\Sigma}}}\right) \cdot a_1 f_{dsm} \quad \text{Equation 12}$$

where rem( ) is the remainder function. This remainder function represents the extra time between the end of the last full ΔΣ switching pattern and the end of the symbol window. The probability that an extra cycle will occur is this extra time divided by the pattern time of the ΔΣ. After simplification, the equation becomes $$\varepsilon = 0.59 BW \cdot \text{rem}\left(\frac{\frac{1}{BW}}{\frac{1}{a_1 f_{\Delta\Sigma}}}\right) \quad \text{Equation 13}$$

when $a_1$ is as defined in Equation 3. Dividing by the desired amplitude, it can be seen that the average EVM due to amplitude error is defined as $$EVM = \frac{\varepsilon}{A_{desired}} = \frac{BW}{a_1} \cdot \text{rem}\left(\frac{\frac{1}{BW}}{\frac{1}{a_1 f_{\Delta\Sigma}}}\right) \quad \text{Equation 14}$$

It can be seen that the EVM is proportional to instantaneous bandwidth and inversely proportional to the amplitude of the symbol point. This is in line with the behavior of most modulators. In the case of the 10 MHz signal discussed previously, the average EVM at the lowest amplitude point would be 4.0%, while the highest amplitude point in the swallowing region would be only 0.5%.

A similar degradation occurs for phase error. Like the amplitude error, the average phase error is determined by the probability of having one extra cycle at some output phase $\phi_{x+1}$ instead of $\phi_x$ multiplied by the marginal error associated with this extra cycle. The phase error can be expressed as $$\varepsilon_\phi = \frac{BW}{f_{\Delta\Sigma}} \cdot 36° \cdot \text{rem}\left(\frac{\frac{1}{BW}}{\frac{1}{a_1 f_{\Delta\Sigma}}}\right) \quad \text{Equation 15}$$

Because the phase error is expected to be small, the EVM associated with this phase error is approximately $$EVM = \sin(\varepsilon_\phi) \quad \text{Equation 16}$$

While swallowing mode will have both amplitude and phase error, there is minimal amplitude error in the pulse width mode, Because the amplitude error associated from going between two non-zero pulse widths is small (e.g. 0.95 to 1). Therefore, the EVM in the pulse width region is primarily due to phase error. When the amplitude and phase errors of all constellation points are averaged together, an average estimated EVM of 1.4% is yielded. When geometrically combined with the distortion error, the total expected EVM for this system with a 10 MHz bandwidth is approximately 1.6%.

Both the amplitude and phase error have more complex relationships when ρ is non-zero. In this case, the probability of an extra cycle becomes mathematically non-tractable. However, the overall mechanism of potentially having an extra cycle on either of the multiplexer select signals remains as the main source of error. It is expected that the average EVM will not change significantly with the addition of non-zero values of p.

This assertion will be verified in the Experimental Examples below, where a measured constellation shows good agreement with the ideal results. It should be noted that a device of the present disclosure could specifically use ΔΣ sampling frequencies that are related to the window frequency. For example, if an exemplary device used a sampling frequency of 640 MHz for a 10 MHz signal and 6 bit ΔΣ, theoretically the ΔΣ window and symbol window would be perfectly in line. Such an implementation would require additional calibration to ensure the frequencies are in good agreement with one another.

As discussed above and shown below in the Experimental Examples, the disclosed system allows for significantly improved dynamic range over existing systems. In some embodiments, a system of the present disclosure is configured to deliver a dynamic range of at least 20 dB. In some embodiments, the delivered dynamic range may be at least 25 dB, at least 28 dB, at least 30 dB, or about 31 dB.

Figure 8:
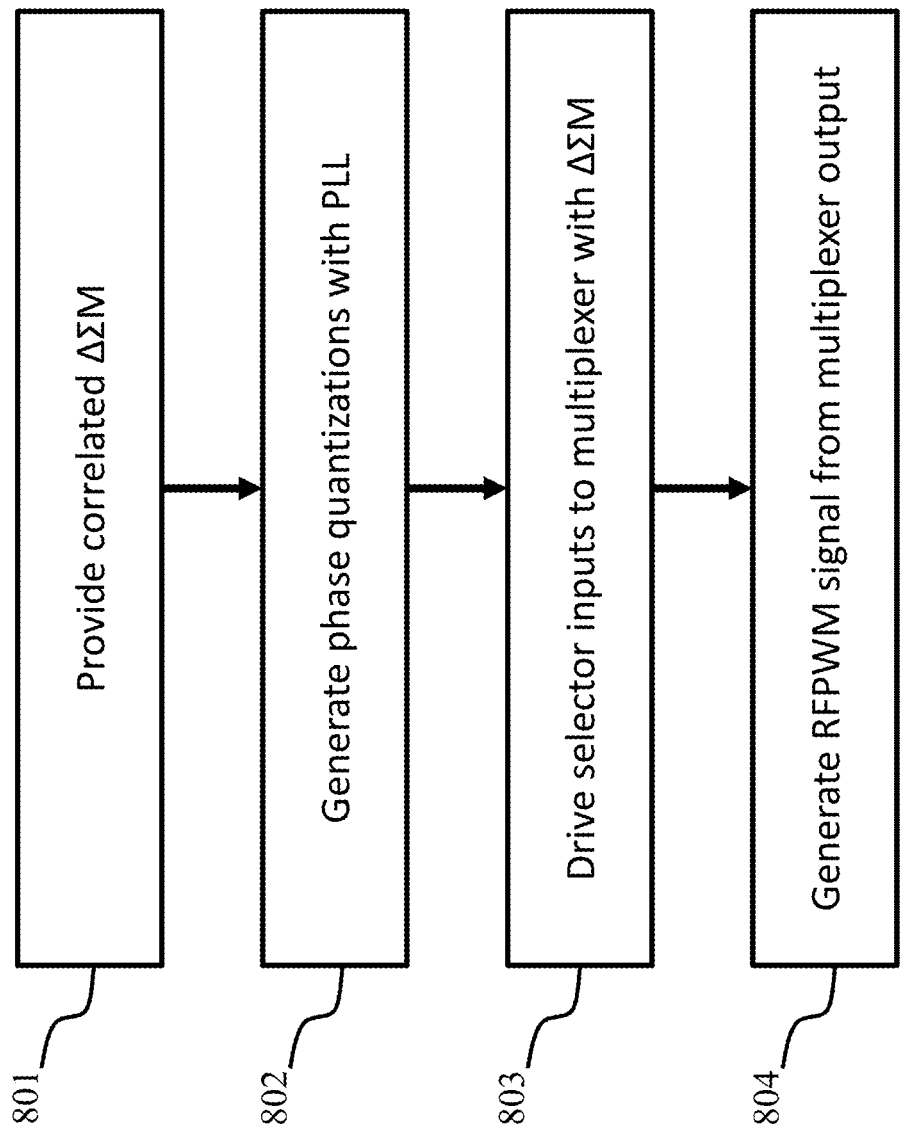
FIG. 8 is a method of generating an RFPWM signal.

With reference now to FIG. 8, a method of generating an RFPWM signal is shown. The depicted method comprises the steps of providing a correlated delta sigma modulator (ΔΣM) in step 801, generating a plurality of phase quantizations with a phase-locked loop (PLL) in step 802, driving a plurality of selector inputs of at least one multiplexer with the delta sigma modulator in step 803, and generating an RFPWM output signal from the output of the multiplexer in step 804.

EXPERIMENTAL EXAMPLES

The invention is further described in detail by reference to the following experimental examples. These examples are provided for purposes of illustration only, and are not intended to be limiting unless otherwise specified. Thus, the invention should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present invention. The following working examples therefore, specifically point out the exemplary embodiments of the present invention, and are not to be construed as limiting in any way the remainder of the disclosure.

System Design

Figure 10:
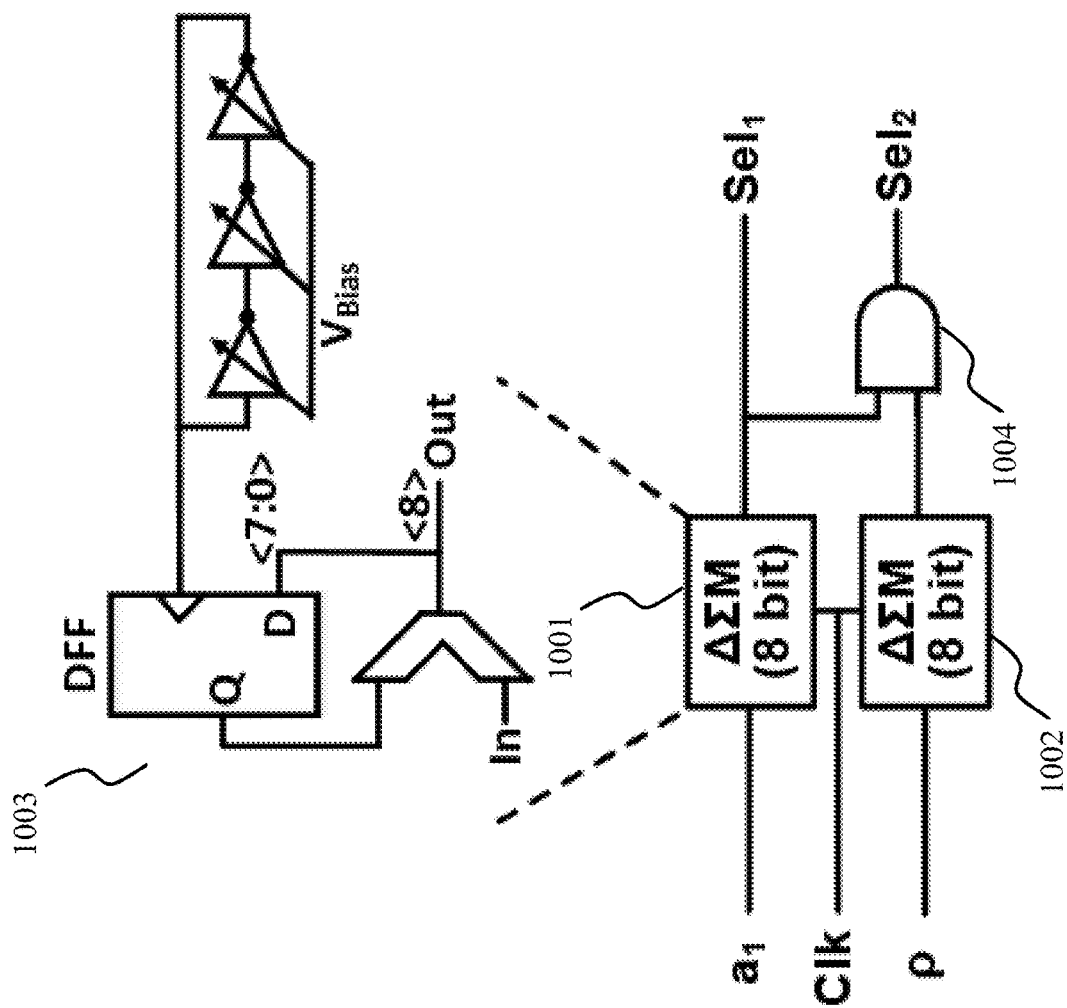
FIG. 10 is a schematic of an exemplary architecture for a correlated $\Delta\Sigma M$.

A correlated ΔΣM was implemented as shown in FIG. 10 comprising two standard 8 bit digital ΔΣMS 1001 and using the overflow of an 8-bit counter 1003. The output of the second ΔΣ 1002 was able to be correlated to the first 1001 by ANDing the two ΔΣs' outputs together with AND gate 1004. The ΔΣM was clocked with an open loop ring voltage-controlled oscillator (VCO). The VCO operated at an unrelated frequency to the transmitted waveform, thus avoiding high spur levels and periodic glitches associated with correlated patterns. It should be noted that the phase noise of the open loop VCO did not affect the phase noise of the transmitted waveform, because the addition of uncorrelated noise to an uncorrelated clock is still uncorrelated. The sampling clock was generated by VCO, with frequency set by an external analog tuning voltage. The frequency was able to be tuned to the desired frequency by noting a small spur associated with clock feedthrough. Due to the digital (nonlinear) nature of the output driver, this spur had a low amplitude (−60 dBc) and was below the noise floor when the modulator was turned on. The overall range of the VCO was approximately 100 MHz to 1.2 GHz, but in some embodiments the range of a VCO for use with a device of the disclosure may be in a range from 20 MHz to 10 GHz, 10 MHz to 20 GHz, or 10 MHz to 39 GHz.

To control the correlation coefficient, ρ, the ΔΣM controlling $a_2$ was implemented with an identical Delta-Sigma modulator, but its input data was periodically overwritten with zeros. The number of zeros added was a negative linear function of ρ where 0 corresponds to 100% replacement, and 1 corresponds to 0% replacement. Not shown in FIG. 10 is a switch network that allows $Sel_1$ and $Sel_2$ to be swapped.

Figure 11:
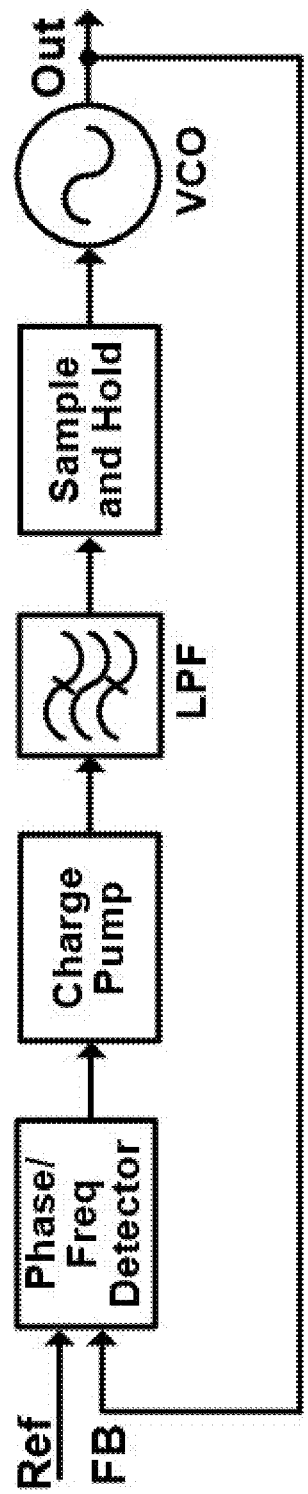
FIG. 11 is a schematic of an exemplary PLL architecture.
Figure 12:
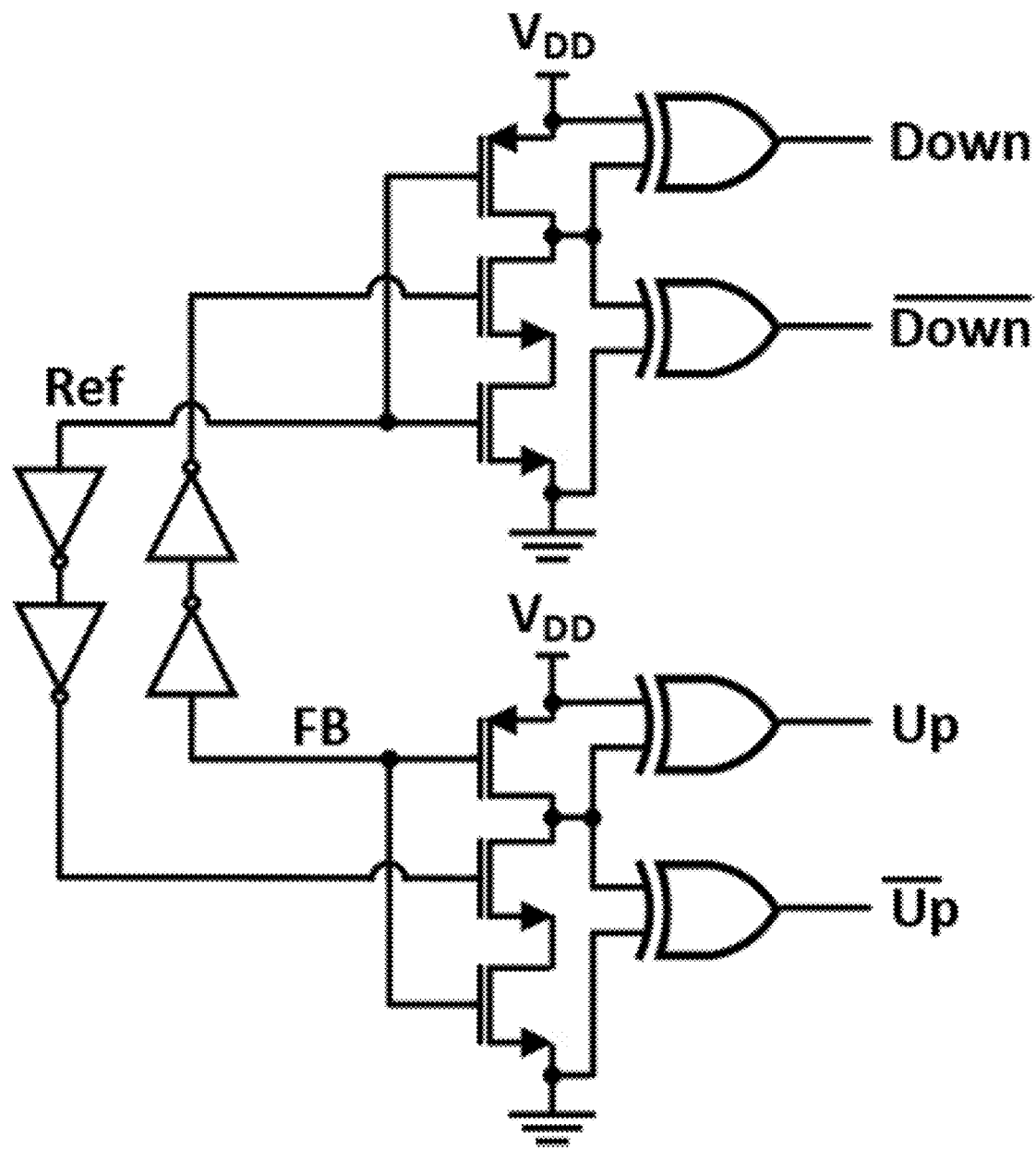
FIG. 12 is a schematic of an exemplary phase frequency detector architecture.
Figure 13:
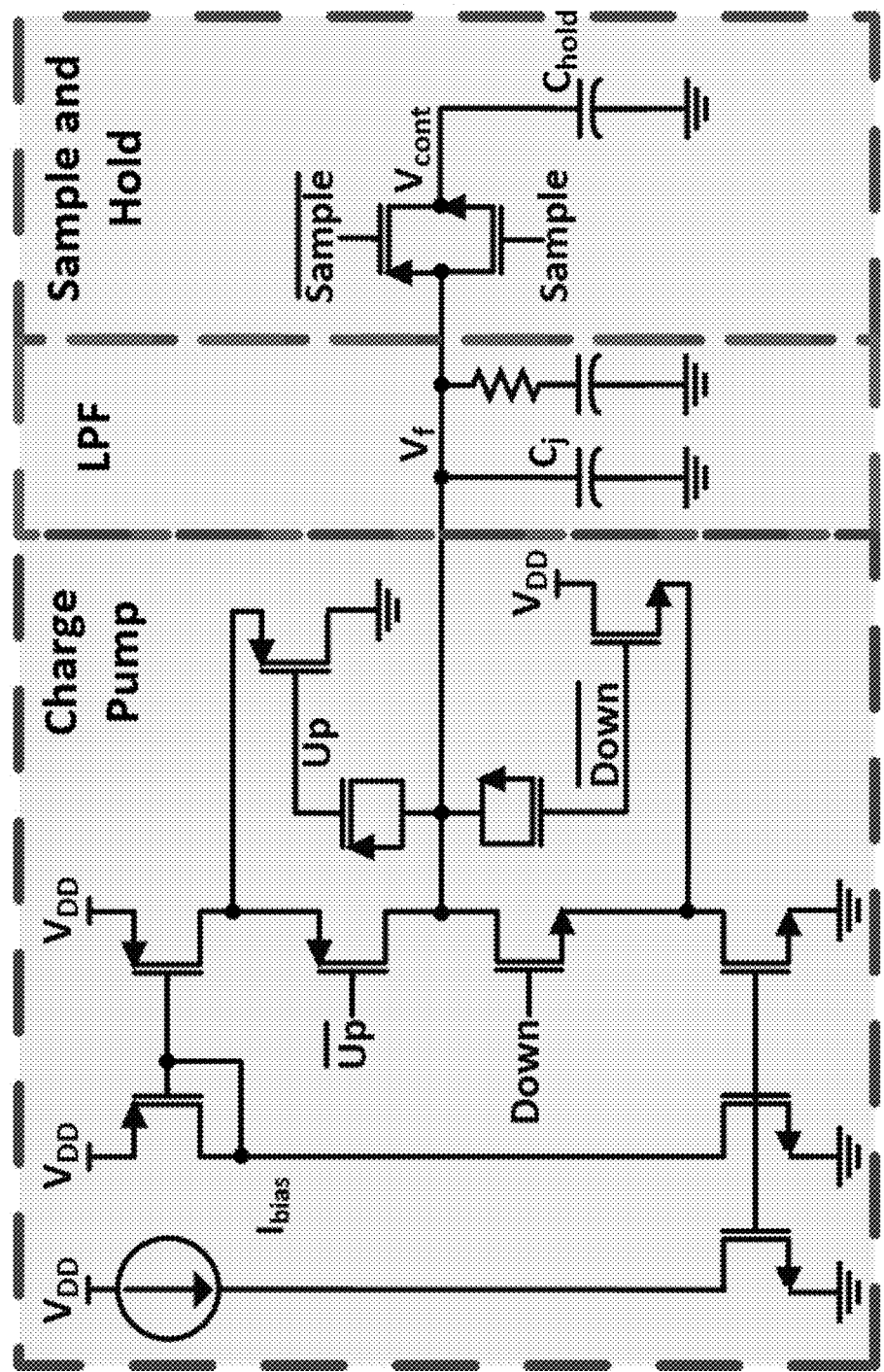
FIG. 13 is a schematic of an exemplary charge pump/low pass filter architecture.

Because there was an expected EVM of 1.6% introduced in the disclosed system from constellation diagram distortion, it was important that the rest of the circuit demonstrate low noise operation. One of the main sources of random noise in any digital transmitter is the frequency synthesizer. In order to maintain low EVM levels, the disclosed device uses a sampled filter dividerless PLL, as shown in FIG. 11. The behavior of this circuit is very similar to a sub-sampling PLL in that it has no divider and does not suffer from $N^2$ noise. A simplified schematic of the phase frequency detector (PFD) used in this topology is shown in FIG. 12. Additionally, a simplified schematic of the charge pump (CP) and loop filter of this PLL is shown in FIG. 13. Unlike a traditional sub-sampling PLL which directly samples the VCO output, the disclosed PLL moved the sampling block to downstream of the low-pass filter (LPF). This reduced the design constraints of the sampling block. In particular, it allowed a smaller, more resistive switching device to be used which reduced the area and power consumed by the sampler. A full description of this PLL's operation can be found in the Experimental Examples.

The overall measured specifications of this PLL are summarized in Table 1 below. As can be seen, the overall noise, area, and power specifications of the disclosed PLL were extremely good. As the ΔΣ s in the disclosed device were small digital blocks, this PLL accounted for a large share of the overall area in the circuit. The FoM value in Table 1 is calculated as $$FoM = 10\log_{10}\left(\frac{\sigma^2}{1s} \cdot \frac{P}{1mW}\right)$$ Equation 17

TABLE 1

| Specification | Measured Value |
| --- | --- |
| Oscillator Type | Ring Oscillator |
| Supply Voltage (V) | 0.9-1.2 |
| Frequency (GHz) | 1.2-2.5 |
| Integrated Jitter (fs) | 250 |
| Integration Bandwidth (Hz) | 10k-40M |
| Reference Spur (dBc) | −46 |
| PN @ 1 MHz Offset (dBc) | −124.8 |
| Power (mW) | 8.5 |
| Area (mm$^2$) | 0.0066 |
| FoM (dB) | −242.7 |

The disclosed device included an on-chip driver that allowed the modulated waveform to drive capacitive or resistive off-chip loads. The driver architecture consisted of cascaded buffers with a fanout of approximately 2 at each stage. Separate rails were used for the cascaded buffers to allow for greater isolation from the modulator, as well as allow increased voltage swings at the output. The driver was designed to be able to drive capacitive loads up to 3 pF at 2.4 GHz across all PVT corners. The maximum output power of the driver with 50Ω load was approximately 5 dBm.

Figure 14:
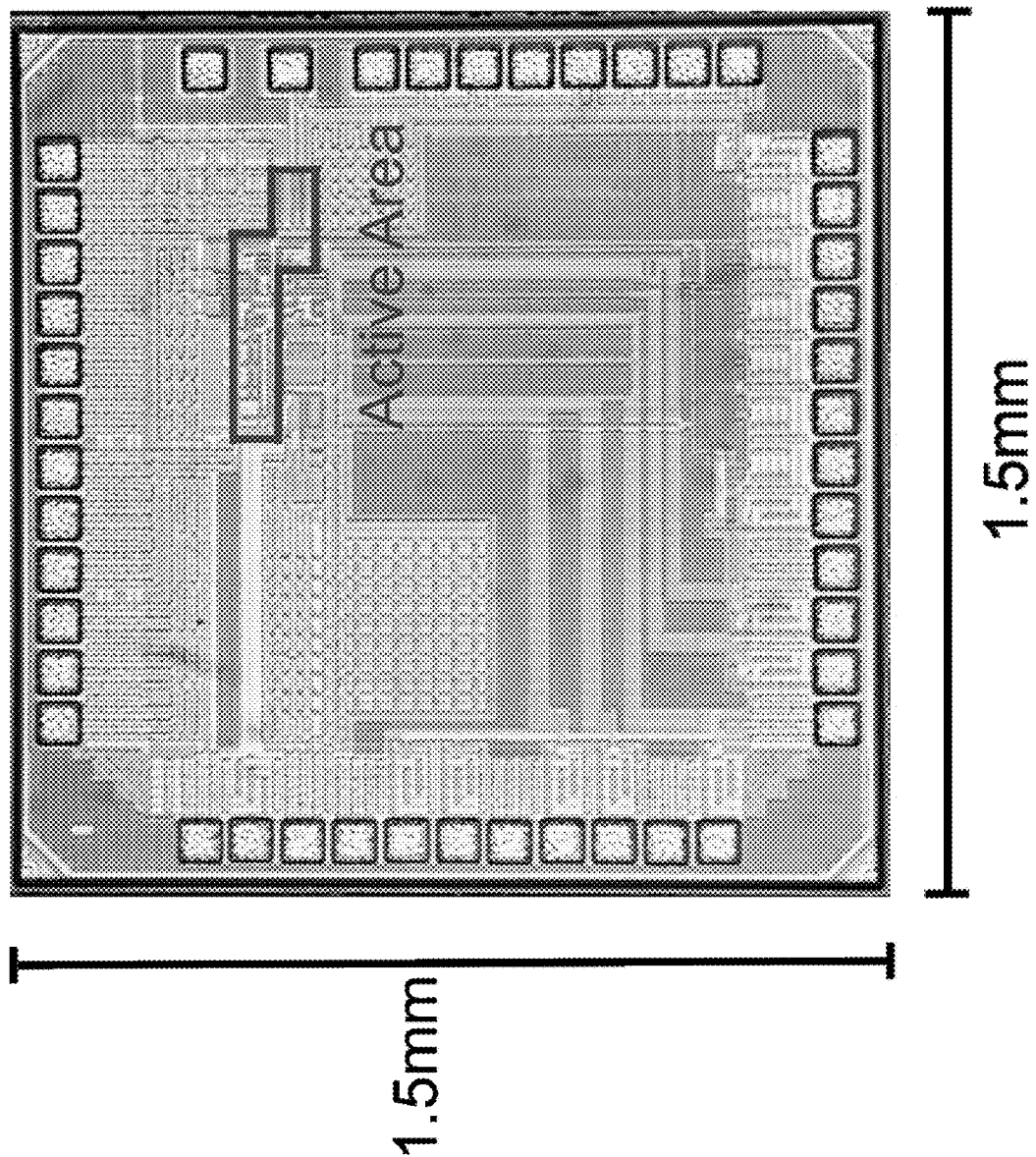
FIG. 14 is an exemplary chip micrograph showing the active area of a device of the disclosure.

Because pulse swallowing was not an issue in the presented system, large fanouts could be used in the driver. This reduced the number of stages needed, and therefore reduced the overall area and power consumption of the driver. A chip micrograph of a die including the active area of a device of the disclosure is shown in FIG. 14. The fanout was designed such that pulse swallowing occurred near fourth pulse width quantization (approximately 20% duty cycle), which would yield a minimum non-interpolated amplitude of approximately 0.59.

Results

Figure 15:
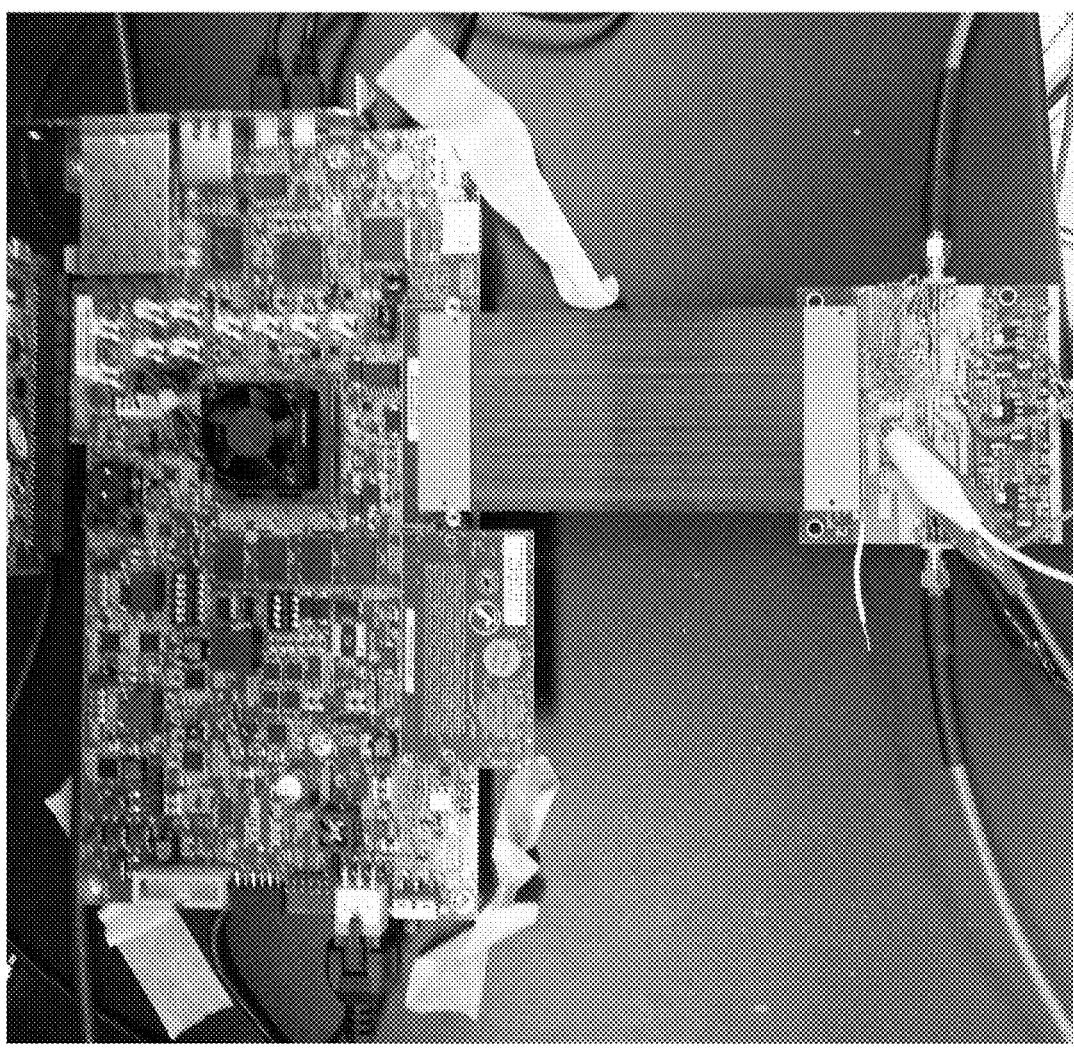
FIG. 15 is a photograph of a test setup.

The disclosed circuit was fabricated in 65 nm bulk CMOS. The PLL and modulator consumed an area of approximately 0.011 mm². An additional 0.0074 mm² was used for the on-chip driver, which allowed the circuit to drive off-chip loads such as a switch-mode power amplifier. The total power consumed by the disclosed circuit is 23 mW. Approximately 4 mW and 8.6 mW of this power was consumed by the PLL and driver respectively. Only 10.4 mW of the total power was consumed by the interpolator. An image of the test setup, including custom board and FPGA, is included in FIG. 15.

It was found during measurement that the pulse swallowing threshold was larger than originally simulated, and 20% pulses were also swallowed at and above 1.6 GHz. While the derivations above assumed a minimum amplitude of 0.59, after distortion the actual minimum unswallowed amplitude was approximately 0.8. This increase was assumed to be due to unmodeled parasitics and/or manufacturing tolerances in the driver, causing larger than expected capacitive loads between stages. Because of this degradation, the system only had a dynamic range of approximately 1.8 dB without interpolation. However, as discussed further below, the disclosed circuit was capable of meeting all specifications even with this degradation in non-interpolated performance.

Figure 16:
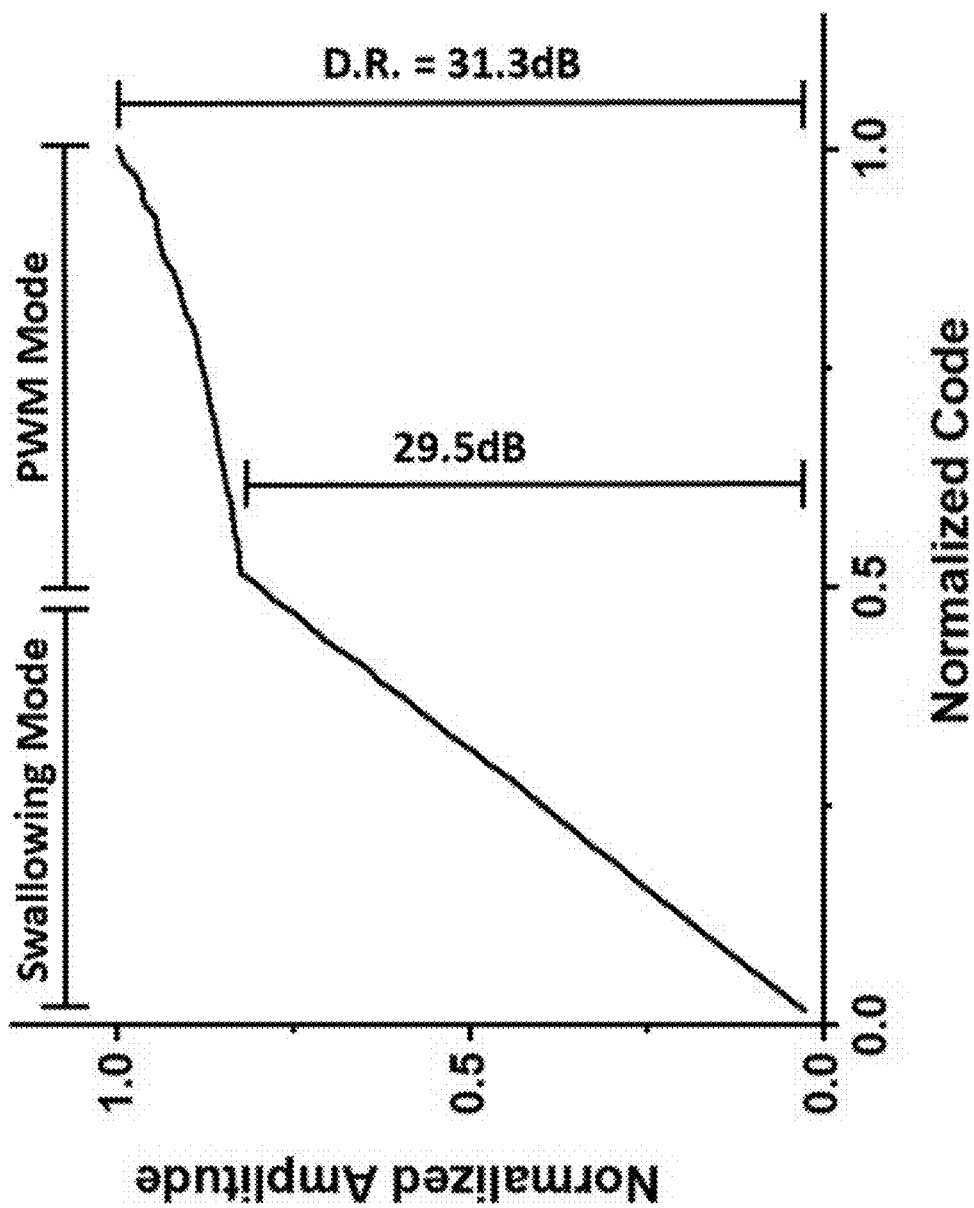
FIG. 16 is a graph of measured output amplitude vs. input code.

A plot of the measured fundamental amplitude versus input code is included in FIG. 16. For this particular plot, a carrier frequency of 1.6 GHz and sampling frequency of approximately 800 MHz was used, but other frequencies yielded similar results. It can be seen that there are two distinct regions of operation shown in FIG. 16. The pulse width (PWM) mode is where, no matter the state of the ΔΣM output, the pulse is not swallowed. In this mode, the output amplitude was the same as if a standard RFPWM was operating with extremely fine phase quantizations (whereas the presented RFPWM would ordinarily only have 3 amplitude quantizations without the interpolators). Under this mode of operation, the output can be well approximated by Equation 6 above. The other mode, labeled "Swallowing Mode", corresponds to codes that cause a non-zero number of the pulse widths to be below the driver's pulse swallowing threshold. It can be seen that its transfer function is entirely linear. Any deviation from linearity in swallowing mode is within the uncertainty range of the test equipment. This transfer function agrees very well with the derived transfer function given in Equation 8 above. While the ΔΣ is capable of generating 8 bit codes, the codes tested in FIG. 16 only go down to a ΔΣ ratio of 1/32. This is because ratios utilizing the LSBs yield extremely high EVMs and close-in spurs, and are therefore not suitable for transmission. Because the driver limits output duty cycles to greater than 20%, the minimum achievable normalized amplitude without interpolation is approximately 0.8 after distortion. Therefore the addition of the interpolator yields a dynamic range improvement of approximately 29 dB. An additional 18 dB (20 log$_{10}$(2³)) of dynamic range extension is possible if the full code length is used.

Figure 17:
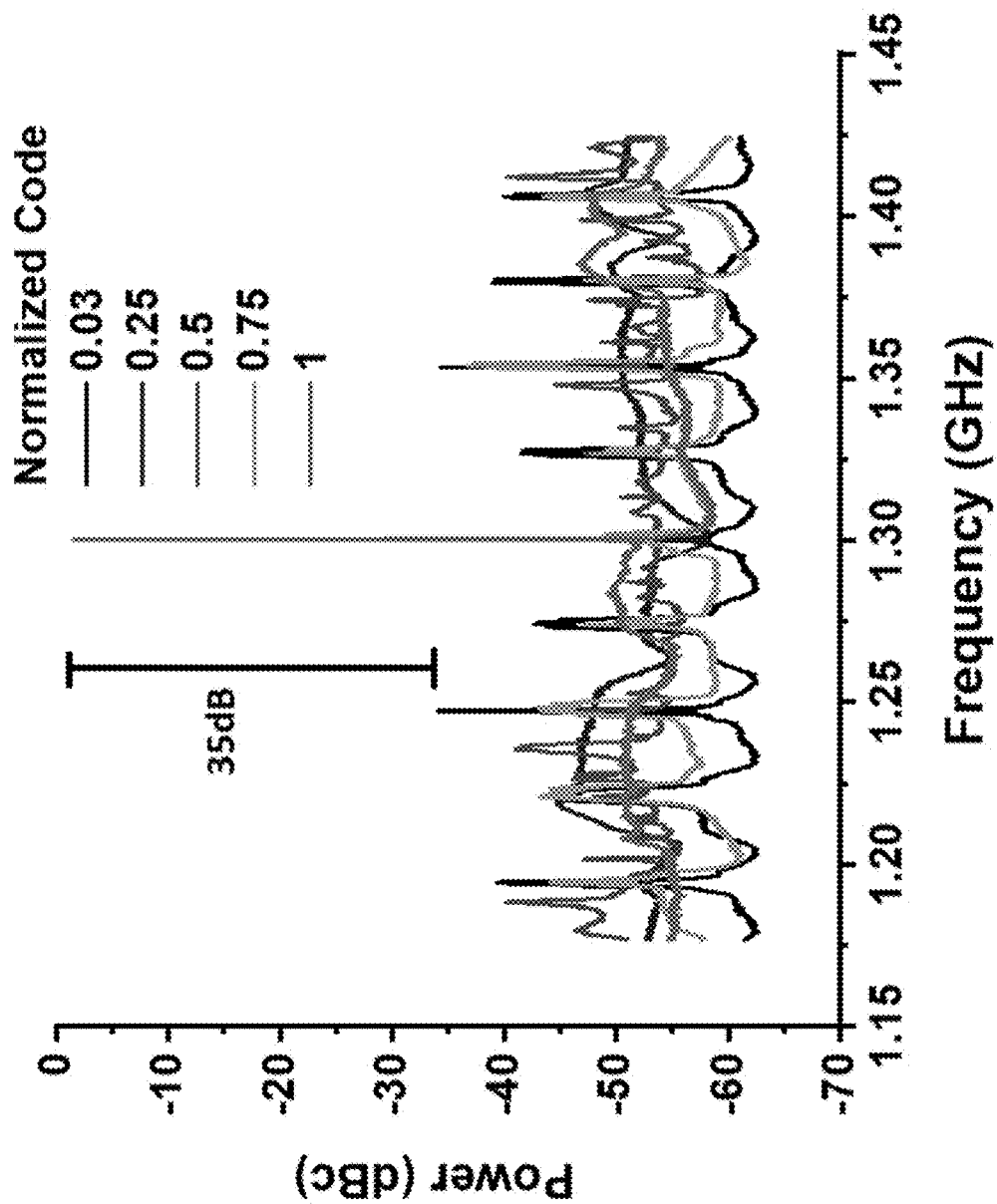
FIG. 17 is a graph of measured output spectra for various codes in swallowing mode.

A plot of the output spectrum for a single tone in the swallowing mode is included in FIG. 17. As can be seen, this architecture suffered from significant spurs due to idle tones in the Δ. The spacing of these spurs was dependent on the pattern frequency of the ΔΣM. While these spurs are relatively large, there are no spurs within $$\pm \frac{f_{\Delta\Sigma} GCD(code, code_{max})}{code_{max}},$$

where $f_{\Delta\Sigma}$ is the ΔΣM sampling frequency and GCD is the greatest common divisor function. For example, if the ΔΣ has a code of 1 out of 256 at a sampling rate of 800 MHz, then the lowest frequency spur would be located at 800 M/256=3.125 MHz. The same frequency spur would also occur for a code of 255 out of 256. The condition of this equation is that $f_{\Delta\Sigma}$ does not exceed $f_c/2$. In the case of sampling frequencies greater than $f_c/2$, the spacing is defined as $$\pm \frac{(f_c - f_{\Delta\Sigma}) GCD(code, code_{max})}{code_{max}}.$$

This spacing prevents any corruption of the in-band signal. Because any switch-mode PA located downstream of the ΔΣM must already have harmonic terminations and impedance matching circuits, it is assumed that the spurs will be filtered out after the power amplifier. Depending on the bandwidth and filter quality factor, the spacing presented in FIG. 17 may not be sufficient to meet spectral mask requirements. In this case, accuracy can be traded for spur spacing. Because the spacing is inversely proportional to the GCD( ) function, the spacing will double for each LSB that is truncated (set to 0). In one disclosed design, three LSBs were truncated, yielding a minimum normalized code of 0.03 with a minimum spur offset frequency of 25 MHz. Furthermore, the locations of the subharmonic spurs were dependent on the individual constellation point being transmitted. In a fully modulated waveform, the spurs of each symbol are averaged together, providing some level of attenuation for each of the spurs. Further spur suppression could be accomplished via traditional idle tone suppression techniques such as chaotic feedback or dithering.

The noise floor in each of the spectral plots shown in FIG. 17 is set by a combination of PLL noise, ΔΣ pattern noise, and glitch noise. Glitch noise is caused by a random event where the multiplexer switches midway through an output pulse, thus causing a pulse width not equal to the two desired amplitudes. This type of noise is avoided in some embodiments by the use of a glitch-free multiplexer.

Figure 18:
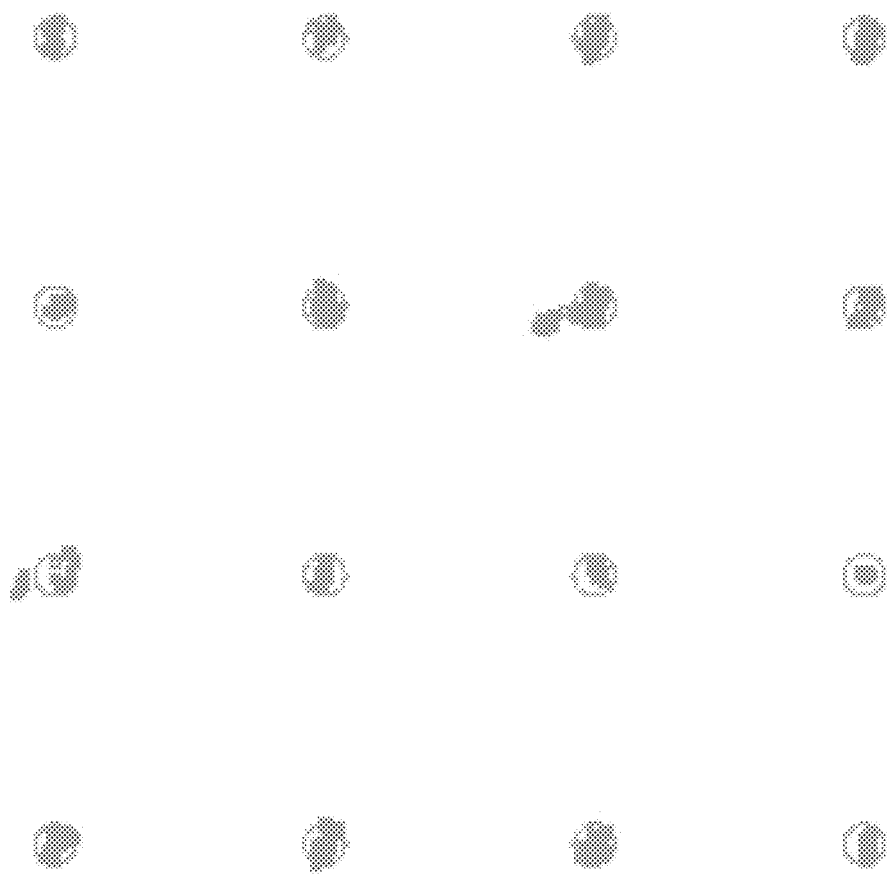
FIG. 18 is a measured 16 QAM constellation.
Figure 19:
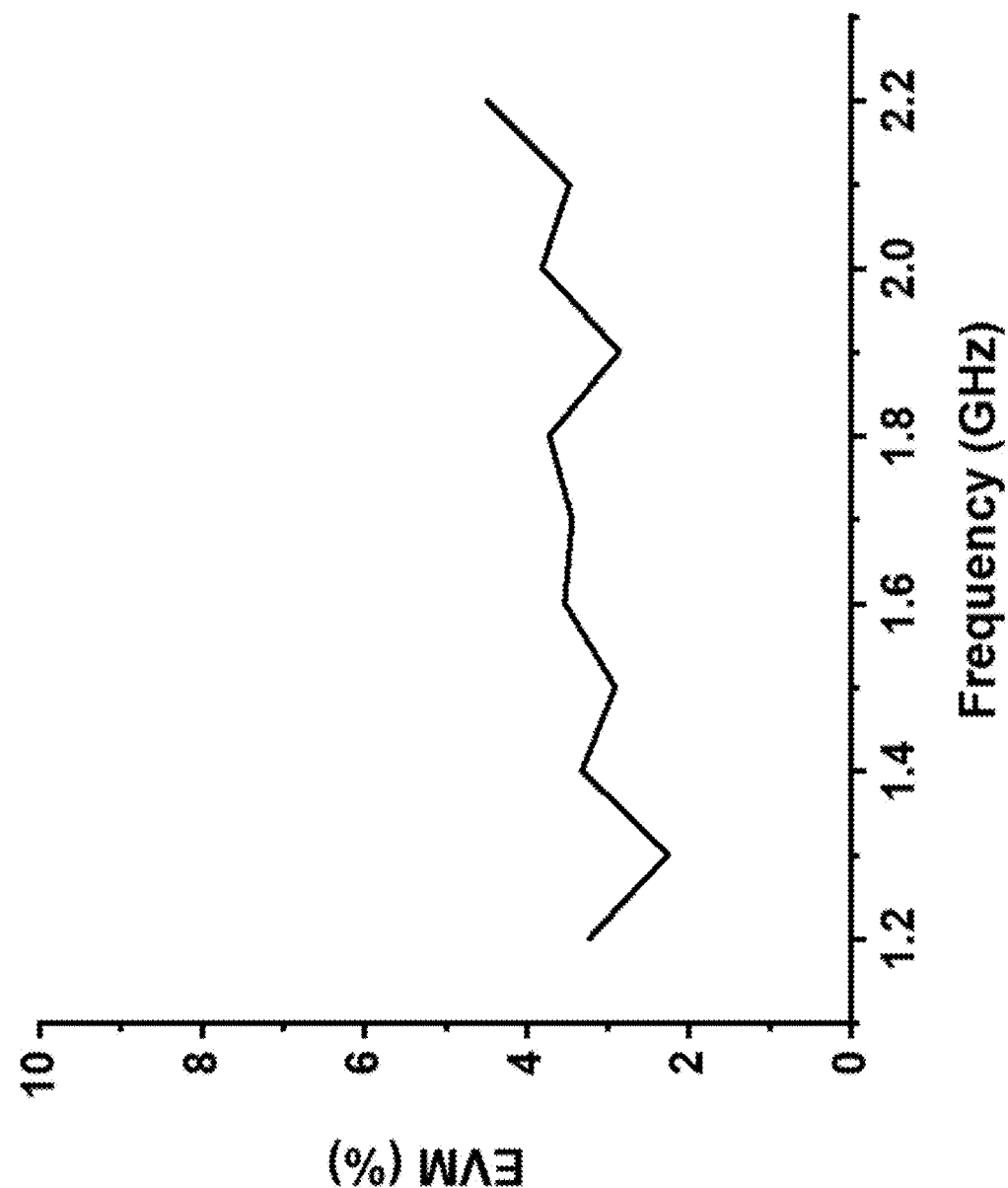
FIG. 19 is a graph of EVM vs. carrier frequency.

A plot of a measured 16 QAM constellation with 1 MHz symbol rate is shown in FIG. 18. It can be seen from this plot that the presented system is fully capable of transmitting 16 QAM signals. It can also be seen that the average EVM is 2.27%, which is well within specification for most modern communication protocols. The particular constellation shown in FIG. 18 was generated for a carrier frequency of 1.3 GHz, but similar constellations and EVM levels are yielded over the entire frequency range of 1.2 to 2.2 GHz. FIG. 19 shows the EVM as a function of frequency. As can be seen, there was no strong dependence between frequency and EVM. This is to be expected, because phase shifting occurs in the phase domain (rather than time domain) and the amplitude is controlled by the swallowing ratio. Neither of these control mechanisms is frequency dependent. The modulator itself also has the dynamic range and accuracy necessary to transmit 64 QAM. Unfortunately, the test setup used was not capable of demodulating a 64 QAM constellation. As such, no 64 QAM results are included here.

Figure 20:
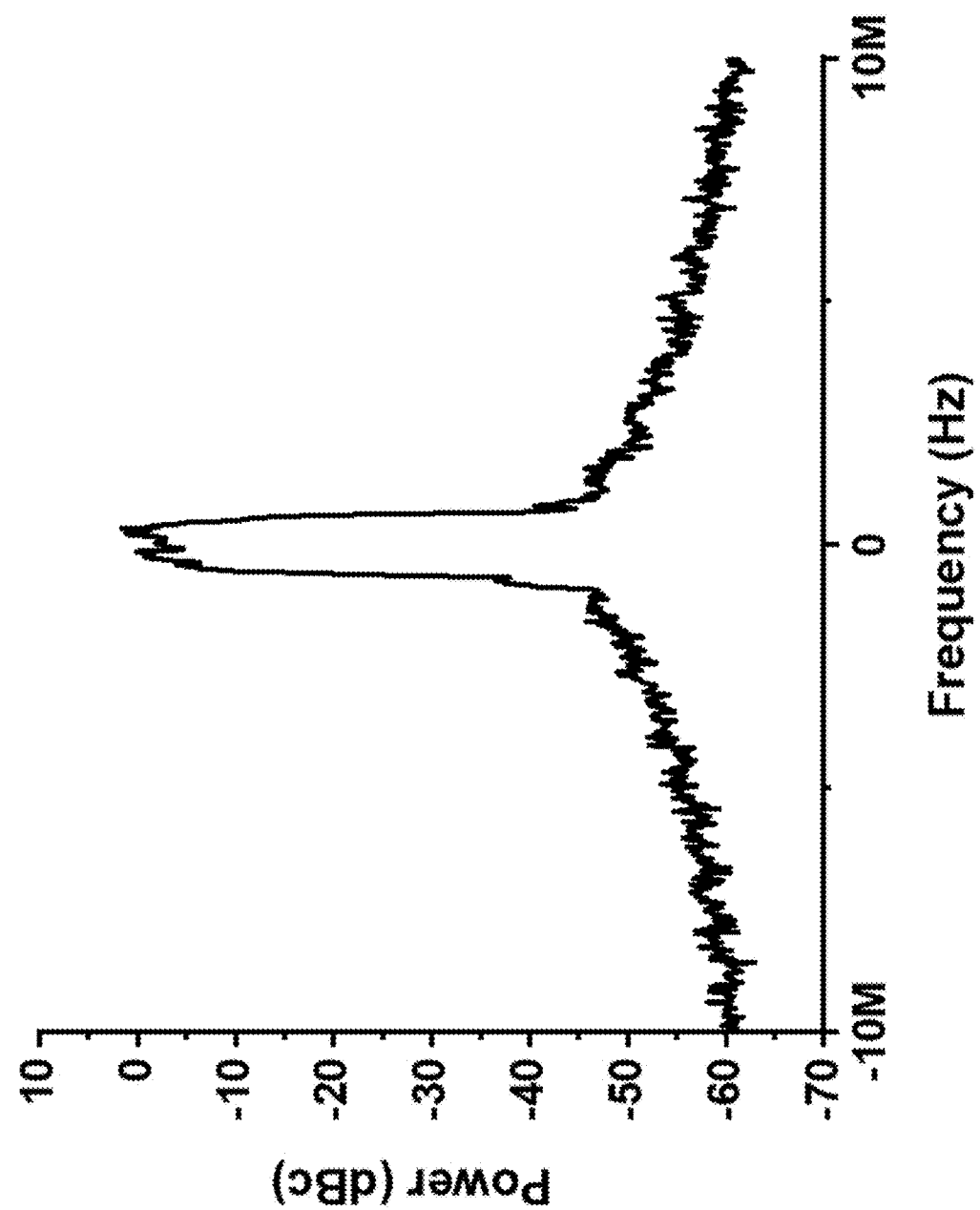
FIG. 20 is a graph of measured output spectrum with 1 M symbol/s transmission.

A plot of the output spectrum associated with FIG. 18 at a 1 Msymbol/second modulation rate is included in FIG. 20. The modulator may in some embodiments be used to drive a switched mode power amplifier (SMPA). Thus, a modulator of the present disclosure may not include a pulse shaping filter, as one is assumed to be integrated within the SMPA. To show that the presented modulator would be expected to meet spectral mask requirements when integrated with a downstream SMPA, a raised cosine filter with β=0.3 is superimposed on the spectrum in post-processing. No digital pre-distortion (DPD) is used in the generation of this spectrum. While the modulator itself is capable of generating waveforms with bandwidth in excess of 20 MHz, the symbol rate is limited in the disclosed example to 1 MHz by the SPI interface.

A table of the summarized system performance is included in Tables 2 and 3 below. As can be seen, the disclosed system has the larger dynamic range than all state of the art RFPWM modulators. The circuit also consumes an extremely small area and power. This is possible because no analog interpolator units or long delay lines are needed. The area required is also further reduced by using a very small PLL. The circuit used in the experimental example also demonstrated an EVM of approximately −32 dB. This level of EVM is on par with the other state of the art devices.

TABLE 2

|  | Device A | Device B | Device C |
|---|---|---|---|
| Technology | 40 nm | 130 nm | 65 nm |
| Topology | 2-level RFPWM | Carrier Switching | 3-level RFPWM |
| Dynamic Range (dB) | 10.8 | 23 | 6.4 |
| Active Area (mm$^2$) | 0.35 | 0.46 | 0.48 |
| Frequency (GHz) | 1-3 | 1.8-2.5 | 2.66 |
| Spur Level (dBc) | −20 | −28 | Not Reported |
| EVM (dB) | −28 | −25.5 | −24.9 |
| Power (mW) | 75 | 98 | 70 |

TABLE 3

|  | Device D | Device E | This Work |
|---|---|---|---|
| Technology | 40 nm | 45 nm | 65 nm |
| Topology | 2-Level RFPWM | ΔΣ (PM only) | ΔΣ (AM & PM) |
| Dynamic Range (dB) | 7.3 | 0 | 31 |
| Active Area (mm$^2$) | 0.48 | 0.15 | 0.019 |
| Frequency (GHz) | 0.9-2.6 | 1-3 | 1.2-2.2 |
| Spur Level (dBc) | Not Reported | −45 | −35 |
| EVM (dB) | −29 | −33.5 | −32.8 |
| Power (mW) | 50 | 34 | 23 |

Regarding Tables 2 and 3, all the results for Device A are specified for 1.2 GHz. The dynamic ranges listed for Devices A, C, and D are based on peak to average power. Further information regarding the various devices used in the comparison above may be found in the references listed below.

CONCLUSION

The disclosed Delta Sigma interpolator allows much finer amplitude and phase resolution than is otherwise possible using ring oscillator/delay line phase shifting. Furthermore, this architecture allows the dynamic range of an RFPWM circuit to be extended by 29 dB. This extended dynamic range represents best in class performance. The presented modulation scheme enables high PAPR communication signals to be processed using digital transmitters and efficient switch-mode power amplifiers. Because the presented system does not require interpolator units, the power and area are significantly reduced.

The following references are incorporated herein by reference:

P. Nuyts, P. Reynaert and W. Dehaene, "A fully digital PWM-based 1 to 3 GHz multistandard transmitter in 40 nm CMOS", 2013 IEEE Radio Frequency Integrated Circuits Symposium (RFIC), 2013. This reference is the source of Device A in Table 2.

K. Grout and J. Kitchen, "Analysis of jitter on RFPWM systems for all-digital transmitters", 2018 Texas Symposium on Wireless and Microwave Circuits and Systems (WMCS), 2018.

H. Gheidi, T. Nakatani, V. Leung and P. Asbeck, "A 13 GHz DeltaSigma-Based Closed-Loop Fully Digital Phase Modulator in 45-nm CMOS SOI", IEEE Journal of Solid-State Circuits, vol. 52, no. 5, pp. 1185-1195, 2017. This reference is the source of Device E in Table 3.

K. Cho and R. Gharpurey, "A Digitally Intensive Transmitter/PA Using RF-PWM With Carrier Switching in 130 nm CMOS", IEEE Journal of Solid-State Circuits, vol. 51, no. 5, pp. 1188-1199, 2016. This reference is the source of Device B in Table 2.

H. Song and R. Gharpurey, "Digitally intensive transmitter employing RF pulse width modulation for IoT applications", 2015 IEEE Radio Frequency Integrated Circuits Symposium (RFIC), 2015. This reference is the source of Device C in Table 2.

S. Kulkarni et al., "Multi-standard wideband OFDM RF-PWM transmitter in 40 nm CMOS", ESSCIRC Conference 2015-41st European Solid-State Circuits Conference (ESSCIRC), 2015. This reference is the source of Device D in Table 3.

S. Henzler, S. Koeppe, D. Lorenz, W. Kamp, R. Kuenemund and D. Schmitt-Landsiedel, "A Local Passive Time Interpolation Concept for Variation-Tolerant High-Resolution Time-to-Digital Conversion", IEEE Journal of Solid-State Circuits, vol. 43, no. 7, pp. 1666-1676, 2008.

Ravi, A; et al., "A 2.4-GHz 2040-MHz Channel WLAN Digital Outphasing Transmitter Utilizing a Delay-Based Wideband Phase Modulator in 32-nm CMOS," IEEE J. Solid-State Circuits, vol. 47, no. 12, pp. 3184, 3196, December 2012

M. Pasha, M. Hague, J. Ahmad and T. Johansson, "A Modified All-Digital Polar PWM Transmitter", IEEE Transactions on Circuits and Systems I: Regular Papers, vol. 65, no. 2, pp. 758-768, 2018.

S. Chung, R. Ma, K. Teo and K. Parsons, "Outphasing multi-level RFPWM signals for inter-band carrier aggregation in digital transmitters", 2015 IEEE Radio and Wireless Symposium (RWS), 2015.

S. Chung, P. Godoy, T. Barton, D. Perreault and J. Dawson, "Asymmetric multilevel outphasing transmitter using class-E PAs with discrete pulse width modulation", 2010 IEEE MTT-S International Microwave Symposium, 2010.

B. Franois, P. Reynaert, P. Nuyts and W. Dehaene, "Extending dynamic range of RF PWM transmitters", Electronics Letters, vol. 49, no. 6, pp. 430-432, 2013.

F. Yao, Q. Zhou and Z. Wei, "A Novel Multilevel RF-PWM Method With Active-Harmonic Elimination for All-Digital Transmitters", IEEE Transactions on Microwave Theory and Techniques, vol. 66, no. 7, pp. 3360-3373, 2018.

P. Singerl, C. Schuberth, M. Mataln, D. Seebacher, F. Dielacher and T. Magesacher, "A 2.7-GHz multi-level PWM carrier-bursting RF transmitter", 2015 10th European Microwave Integrated Circuits Conference (EuMIC), 2015.

P. Nuyts, P. Singerl, F. Dielacher, P. Reynaert and W. Dehaene, "A Fully Digital Delay Line Based GHz Range Multimode Transmitter Front-End in 65-nm CMOS", IEEE Journal of Solid-State Circuits, vol. 47, no. 7, pp. 1681-1692, 2012.

M. Taromaru, N. Ando, T. Kodera, and K. Yano, "An EER transmitter architecture with burst-width envelope modulation based on triangle wave comparison PWM," in Proc. IEEE Int. Symp. Personal, Indoor and Mobile Radio Comm. (PIMRC), September 2007, pp. 15.

T. Kodera, N. Ando, and M. Taromaru, "A basic study on EER transmitter with burst-width envelope modulation based on triangle-wave PWM," in Proc. Korea-Japan Microwave Conf., November 2007, pp. 14.

M. Javid and J. Kitchen, "A Multilevel Pulse-Width Modulated Class-E Power Amplifier", 2019 IEEE Radio and Wireless Symposium (RWS), 2019.

P. A. Godoy, S. Chung, T. W. Barton, D. J. Perreault and J. L. Dawson, "A highly efficient 1.95-GHz, 18-W asymmetric multilevel outphasing transmitter for wideband applications," 2011 IEEE MTT-S International Microwave Symposium, Baltimore, Md., 2011, pp. 1-4.

J. S. Walling, S. S. Taylor, and D. J. Allstot, "A class-G supply modulator and class-E PA in 130 nm CMOS," IEEE J. Solid-State Circuits, vol. 44, no. 9, pp. 23392347, 2009.

F. H. Raab, "Radio frequency pulsewidth modulation," IEEE Trans. Commun., vol. COM-21, no. 8, pp. 958966, August 1973.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

What is claimed is:

1. A system for generating an RFPWM signal, comprising:
   a correlated delta sigma modulator having a plurality of outputs;
   a phase-locked loop comprising a plurality of phase quantization outputs;
   at least one multiplexer having a plurality of signal inputs, a plurality of selector inputs, and at least one output, the signal inputs communicatively connected to the phase quantization outputs of the phase-locked loop and the selector inputs electrically connected to the outputs of the correlated delta sigma modulator; and
   a driver having an input communicatively connected to the output of the multiplexer and an output generating an RFPWM signal;
   wherein the correlated delta sigma modulator comprises at least two delta sigma modulators and a counter.

2. The system of claim 1, wherein the at least one multiplexer comprises at least two multiplexers, and further comprising an AND gate with inputs connected to the outputs of the multiplexers and an output connected to the input of the driver.

3. The system of claim 1, wherein the plurality of phase quantization outputs is at least five.

4. The system of claim 1, further comprising a plurality of buffers electrically connected to the phase quantization outputs and the multiplexer signal inputs.

5. The system of claim 1, further comprising a plurality of inverters electrically connected to the phase quantization outputs and the multiplexer signal inputs.

6. The system of claim 1, further comprising a voltage-controlled oscillator connected to the correlated delta sigma modulator.

7. The system of claim 6, wherein a frequency of the voltage-controlled oscillator is in a range from 100 MHz to 1.2 GHz.

8. The system of claim 1, wherein the system is configured to deliver a dynamic range of at least 20 dB.

9. The system of claim 1, wherein the system is configured to deliver a dynamic range of at least 30 dB.

10. A method of generating an RFPWM signal, comprising:
    providing a correlated delta sigma modulator comprising at least two delta sigma modulators and a counter, the correlated delta sigma modulator having a plurality of outputs;
    generating a plurality of phase quantizations with a phase-locked loop;
    driving a plurality of selector inputs of at least one multiplexer with the plurality of delta sigma modulator outputs to select at least one phase quantization as an output to the multiplexer; and
    generating an RFPWM output signal from the output of the multiplexer.

11. The method of claim 10, further comprising the step of alternating between at least two phase quantizations to generate an average effective phase having a phase value between the at least two phase quantizations.

12. The method of claim 10, comprising generating the plurality of phase quantizations in increments of at most $\pi/5$.

13. The method of claim 12, comprising generating the plurality of phase quantizations in increments of at most $\pi/8$.

14. The method of claim 10, comprising modifying one or more parameters of the phase-locked loop and changing the plurality of phase quantizations.

15. The method of claim 10, comprising driving a plurality of selector inputs of at least two multiplexers.

16. The method of claim 15, comprising combining at least one output from each of the at least two multiplexers with a logic gate.

17. The method of claim 16, wherein the logic gate is an AND gate.

18. The method of claim 10, comprising driving an input of a driver with the output of the multiplexer.

* * * * *